US012701697B2

(12) United States Patent
Chang et al.

(10) Patent No.: US 12,701,697 B2
(45) Date of Patent: Aug. 4, 2026

(54) INTEGRATED CIRCUIT DEVICE, MEMORY DEVICE, AND METHOD OF MANUFACTURING

(71) Applicant: TAIWAN SEMICONDUCTOR MANUFACTURING COMPANY, LTD., Hsinchu (TW)

(72) Inventors: Meng-Sheng Chang, Hsinchu (TW); Chia-En Huang, Hsinchu (TW); I-Hsin Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 406 days.

(21) Appl. No.: 18/452,973

(22) Filed: Aug. 21, 2023

(65) Prior Publication Data

US 2024/0334689 A1 Oct. 3, 2024

Related U.S. Application Data

(60) Provisional application No. 63/492,362, filed on Mar. 27, 2023.

(51) Int. Cl.
*H10B 20/25* (2023.01)

(52) U.S. Cl.
CPC .................................... *H10B 20/25* (2023.02)

(58) Field of Classification Search
CPC ................................ H10B 20/25; H10B 20/50
See application file for complete search history.

(56) References Cited

U.S. PATENT DOCUMENTS

| | | | |
|---|---|---|---|
| 9,318,651 B2 | 4/2016 | Avramescu et al. | |
| 11,239,255 B1 | 2/2022 | Xie et al. | |
| 11,309,434 B2 | 4/2022 | Mahmoud et al. | |
| 12,317,514 B2 * | 5/2025 | Sung ...................... | H10B 63/30 |
| 2020/0328210 A1 * | 10/2020 | Wu ..................... | H10D 84/0151 |
| 2023/0309324 A1 * | 9/2023 | Wu ........................ | H10B 63/30 |
| 2024/0258387 A1 * | 8/2024 | Siao ................... | H10D 30/6735 |

FOREIGN PATENT DOCUMENTS

EP 3262684 1/2022

* cited by examiner

*Primary Examiner* — Allison Bernstein
(74) *Attorney, Agent, or Firm* — Hauptman Ham, LLP

(57) ABSTRACT

An integrated circuit (IC) device includes a substrate, a bottom semiconductor device over the substrate, and a top semiconductor device over the bottom semiconductor device in a thickness direction of the substrate. The top semiconductor device and the bottom semiconductor device are of a same conductivity type.

20 Claims, 21 Drawing Sheets

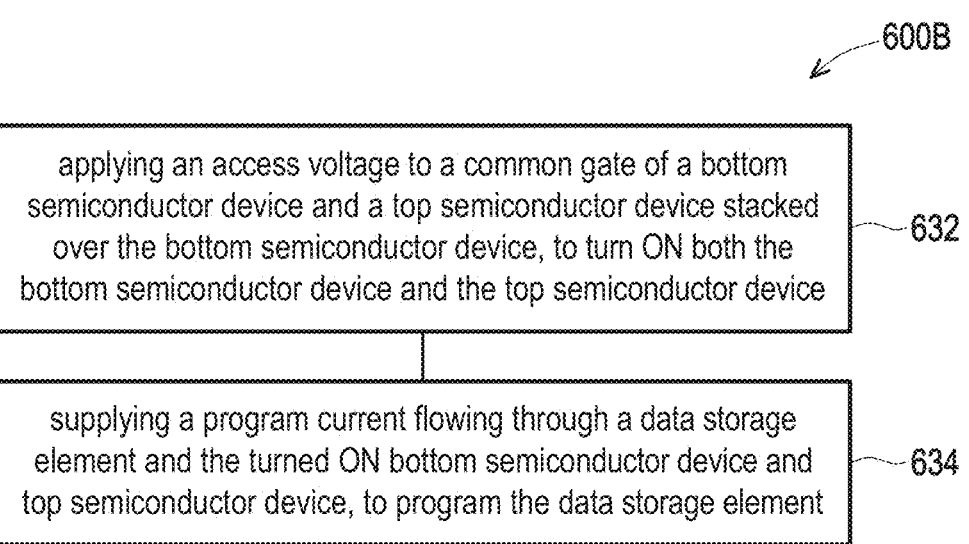

600B applying an access voltage to a common gate of a bottom semiconductor device and a top semiconductor device stacked over the bottom semiconductor device, to turn ON both the bottom semiconductor device and the top semiconductor device    632 supplying a program current flowing through a data storage element and the turned ON bottom semiconductor device and top semiconductor device, to program the data storage element    634

FIG. 6B

INTEGRATED CIRCUIT DEVICE, MEMORY DEVICE, AND METHOD OF MANUFACTURING

RELATED APPLICATION(S)

This application claims the benefit of U.S. Provisional Application No. 63/492,362, filed Mar. 27, 2023, which is herein incorporated by reference in its entirety.

BACKGROUND

An integrated circuit ("IC") device includes one or more semiconductor devices represented in an IC layout diagram (also referred to as a "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

To reduce the sizes of IC devices, sometimes a layer of semiconductor devices is formed, or bonded, over another layer of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6B are flowcharts of various methods, in accordance with some embodiments.

DETAILED DESCRIPTION

Figure 1A:
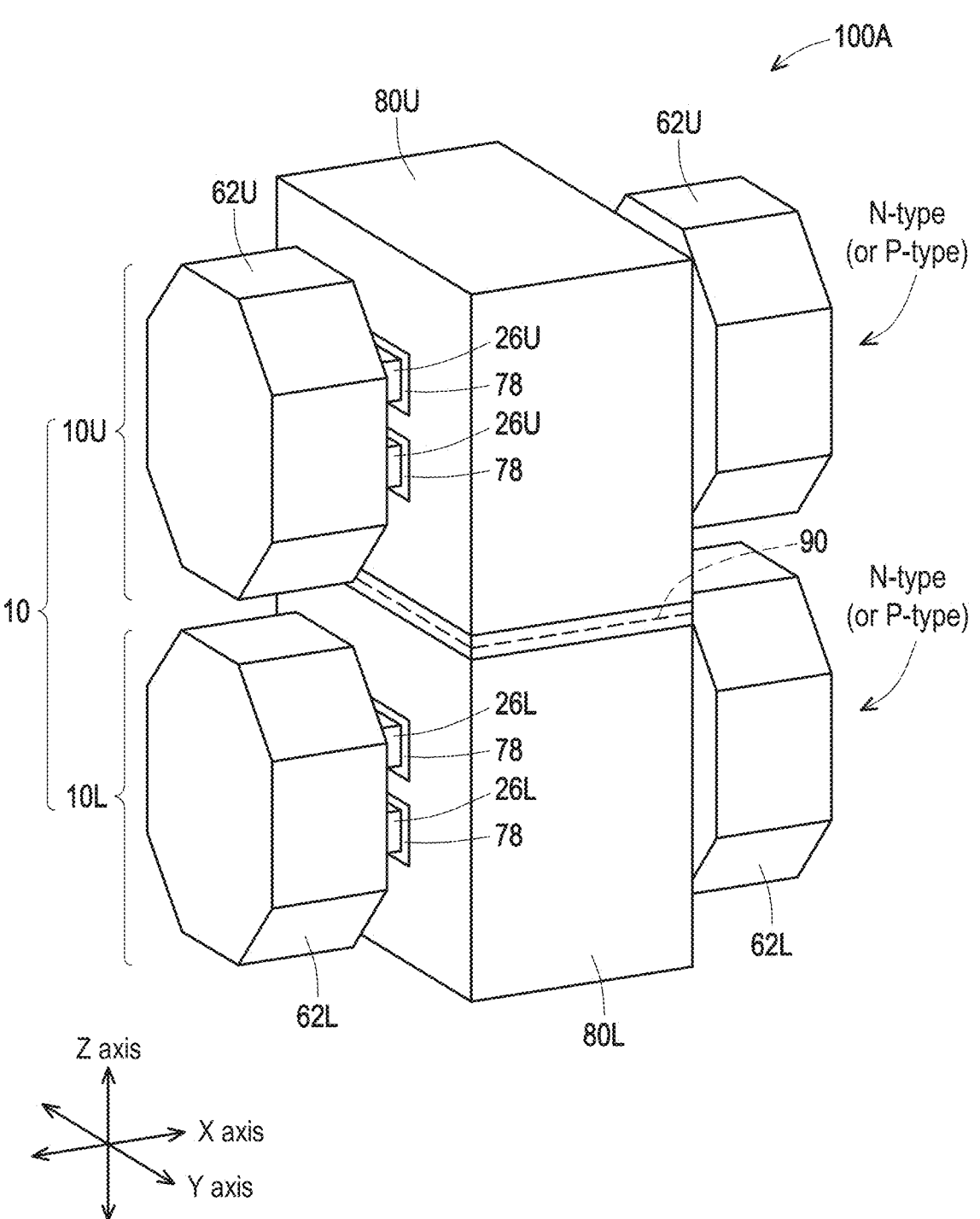
FIG. 1A is a schematic perspective view of a stack of semiconductor devices, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a stack of semiconductor devices comprises a top semiconductor device physically stacked over a bottom semiconductor device. The top semiconductor device and the bottom semiconductor device are of the same conductivity type. This is different from a CFET structure in accordance with other approaches where semiconductor devices of different conductivity types are stacked one over another. For simplicity, a stack of semiconductor devices is sometimes referred to as a device stack. Unless specified otherwise, semiconductor devices in a device stack described herein are of the same conductivity type. In at least one embodiment, by configuring semiconductor devices of the same conductivity type in device stacks, it is possible to reduce the required chip area by about 50%. In some embodiments, semiconductor devices in a device stack are electrically coupled in series, which is advantageous in high voltage applications. In some embodiments, semiconductor devices in a device stack are electrically coupled in parallel, which is advantageous in high current applications. In some embodiments, device stacks are manufactured by CFET processes, with little or no changes. In at least one embodiment, device stacks are advantageously applicable to core devices or core regions of an IC device. Further benefits of device stacks, in one or more embodiments, include improvements in power, performance and/or area (PPA) of IC devices, or the like.

FIG. 1A is a schematic perspective view of a stack of semiconductor devices, or a device stack, 100A, in accordance with some embodiments.

The device stack 100A comprises a stacked structure 10 of a bottom semiconductor device 10L and a top semiconductor device 10U. The bottom semiconductor device 10L is over a substrate. For simplicity, the substrate is not illustrated in FIG. 1A. An example substrate is described with respect to FIGS. 1B-1F. The top semiconductor device 10U is physically stacked over the bottom semiconductor device 10L in a thickness direction of the substrate. The thickness direction is designated as a Z axis in FIG. 1A. Both top semiconductor device 10U and bottom semiconductor device 10L are of a same conductivity type. Conductivity type is sometimes referred to as semiconductor type. Examples of conductivity type include N-type and P-type. In at least one embodiment, both top semiconductor device 10U and bottom semiconductor device 10L are N-type semiconductor devices, and the stacked structure 10 is referred to as an N-on-N structure. In one or more embodiments both top semiconductor device 10U and bottom semiconductor device 10L are P-type semiconductor devices, and the stacked structure 10 is referred to as a P-on-P structure. Examples of semiconductor devices include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In the example configuration in FIG. 1A, the top semiconductor device 10U and bottom semiconductor device 10L are nanosheet FETs. Other semiconductor device configurations are within the scopes of various embodiments. In some embodiments, the top semiconductor device 10U and bottom semiconductor device 10L have different semiconductor device configurations. For example, the bottom semiconductor device 10L is a planar MOS transistor whereas the top semiconductor device 10U is a nanosheet FET.

The top semiconductor device 10U comprises a gate 80U, and source/drains 62U on opposite sides of the gate 80U along an X axis. The gate 80U extends, or is elongated, along a Y axis. The X axis, Y axis, Z axis are mutually transverse to each other. In some embodiments, the X axis, Y axis, Z axis are mutually perpendicular to each other. The top semiconductor device 10U further comprises a channel region configured by nanosheets 26U which extend along the X axis and connect the source/drains 62U. In the example configuration in FIG. 1A, the top semiconductor device 10U comprises two nanosheets 26U. Other numbers of nanosheets per transistor are within the scopes of various embodiments. The top semiconductor device 10U comprises a gate dielectric layer 78 extending around each of the nanosheets 26U, and electrically isolating the gate 80U from the nanosheets 26U. The gate 80U extends around the gate dielectric layer 78 and nanosheets 26U in a configuration referred to as a gate-all-around (GAA) configuration. Other gate configurations are within the scopes of various embodiments.

The bottom semiconductor device 10L comprises a gate 80L, source/drains 62L, a channel region configured by nanosheets 26L, and a gate dielectric layer 78 extending around each of the nanosheets 26L. The gate 80L, source/drains 62L, and nanosheets 26L correspond to the gate 80U, source/drains 62U, and nanosheets 26U. The gate 80U, source/drains 62U, and nanosheets 26U correspondingly overlap the gate 80L, source/drains 62L, and nanosheets 26L along the Z axis. In the example configuration in FIG. 1A, the source/drains 62U, 62L are epitaxy structures of the same conductivity type. For example, all source/drains 62U, 62L are P-type epitaxy structures, or all source/drains 62U, 62L are N-type epitaxy structures.

The stacked structure 10 further comprises an intermediate layer 90 between the gate 80U and gate 80L. In some embodiments, the intermediate layer 90 is a dielectric layer electrically isolating the gate 80U from the gate 80L, in a configuration referred to as an isolated gate configuration in which the gate 80U and gate 80L are controllable independently from each other. In at least one embodiment, the gate 80U and the gate 80L in an isolated gate configuration are still electrically coupled to each other by a conductor, e.g., a gate local interconnect (MGLI). In some embodiments, the intermediate layer 90 is a conductive layer electrically coupling the gate 80U to the gate 80L, in a configuration referred to as a connected gate configuration in which the electrically coupled gate 80U and gate 80L form a common gate for both top semiconductor device 10U and bottom semiconductor device 10L. In a connected gate configuration in accordance with some embodiments, the conductive intermediate layer 90 is formed integrally, and/or simultaneously, with the gate 80U and gate 80L in a single GAA structure.

As can be seen from FIG. 1A, in one or more embodiments, the stacking of the top semiconductor device 10U over the bottom semiconductor device 10L saves about 50% of the required chip area, compared to other approaches without stacking of semiconductor devices. Further, compared to CFET devices where semiconductor devices of different conductivity types are stacked one over another, device stacks in accordance with some embodiments are advantageous in IC regions or circuits or applications where multiple semiconductor devices of one conductivity type, e.g., multiple P-type devices or multiple N-type devices, are required or included, whereas semiconductor devices of the other conductivity type are not required or included. Several examples of such IC regions or circuits or applications are described with respect to one or more of FIGS. 4A-4B, 5A-5C. In some embodiments, it is possible to manufacturing an IC device comprising multiple device stacks by CFET processes, with little or no changes to the manufacturing processes.

Figure 1B:
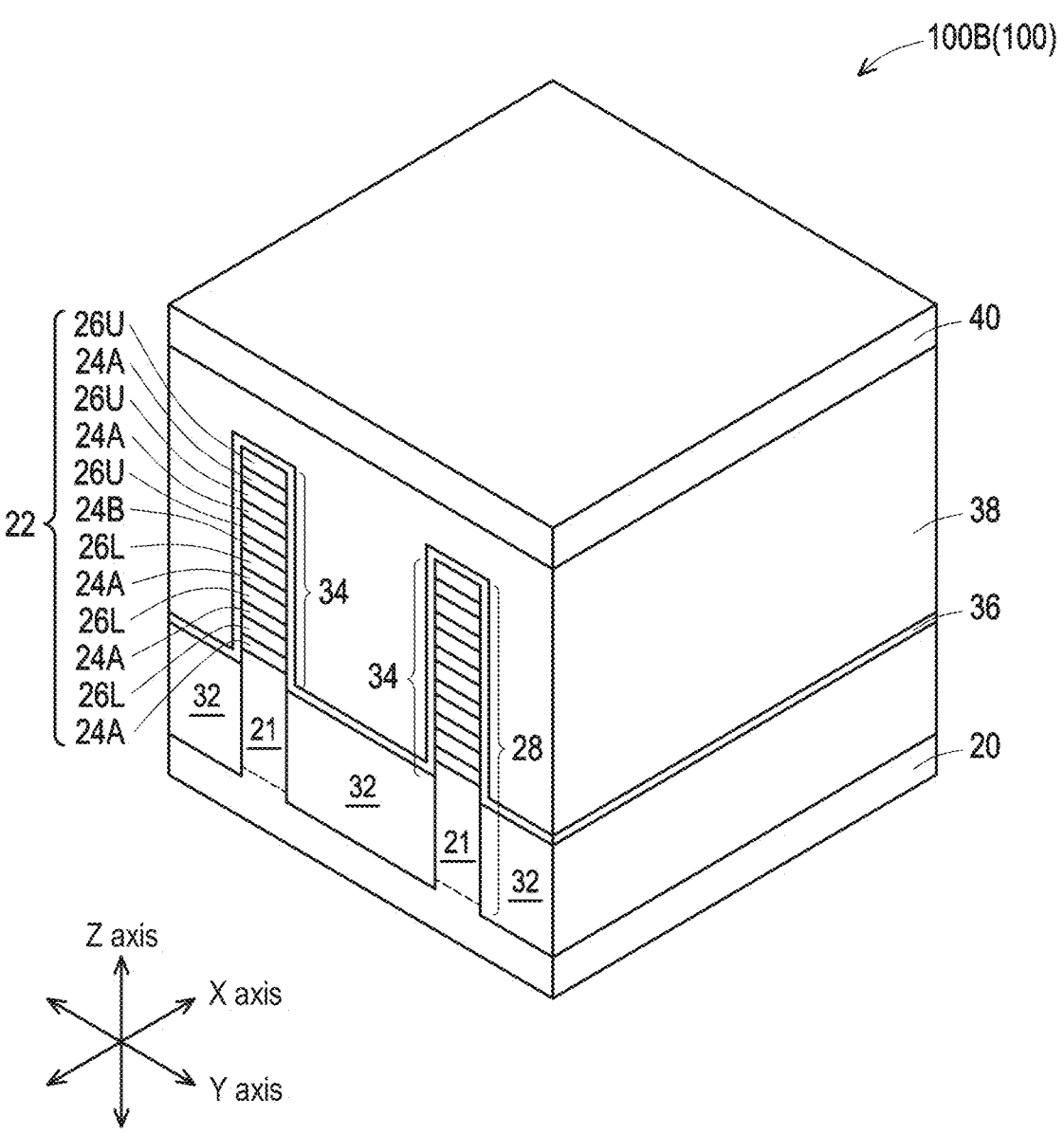
FIG. 1B is a schematic perspective view.

FIG. 1B is a schematic perspective view, and FIGS. 1C-1F are schematic cross-sectional views, in an X-Z plane, of an IC device 100 at various stages in a manufacturing process, in accordance with some embodiments. The IC device 100 comprises a plurality of device stacks corresponding to the device stack 100A. For simplicity, corresponding components in FIGS. 1A-1F are designated by the same reference numerals. In some embodiments, additional operations are provided before, during, and/or after the manufacturing process described with respect to FIGS. 1B-1F, and/or one or more of the described operations are replaced or eliminated, and or the order of the operations is interchangeable.

Referring to FIG. 1B, the manufacturing process starts from a substrate 20. In at least one embodiment, the substrate 20 is a semiconductor substrate. In some embodiments, the substrate 20 includes a single crystalline semiconductor layer on at least the surface of the substrate 20. Example materials of the substrate 20 include, but are not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). For example, the substrate 20 is a Si substrate. In some embodiments, the substrate 20 is a silicon-on-insulator (SOI) substrate, which includes an insulating layer disposed between two silicon layers. In at least one embodiment, the insulating layer is an oxide layer.

A multilayer structure 22 is formed over the substrate 20. In FIG. 1B, the multilayer structure 22 is illustrated in a state after formation of fins, as described herein. The multilayer structure 22 comprises alternatingly arranged first semiconductor layers 24A, 24B and second semiconductor layers 26U, 26L. The second semiconductor layers 26U, 26L correspond to the nanosheets described with respect to FIG. 1A, and are referred to herein by the same reference numerals of the nanosheets, for simplicity. The first semiconductor layers 24A, 24B and the second semiconductor layers 26U, 26L comprise semiconductor materials having different etch selectivity and/or oxidation rates. For example, the first semiconductor layers 24A, 24B comprise SiGe, and the second semiconductor layers 26U, 26L comprise Si. In some embodiments, the first and second semiconductor layers 24A, 24B, 26U, 26L are formed by a deposition process, such as epitaxy. For example, epitaxial growth of the layers of the multilayer structure 22 is performed by a molecular beam epitaxy (MBE) process, a metalorganic chemical vapor deposition (MOCVD) process, and/or other suitable epitaxial growth processes.

Subsequent to the formation of the multilayer structure 22, fins 28 are formed. Each fin 28 comprises a substrate portion 21 of the substrate 20, and a portion 34 of the multilayer structure 22. The portion 34 of the multilayer structure 22 is sometimes referred to as a stack of semiconductor layers 34. In some embodiments, the fins 28 are fabricated using suitable processes, such as double-patterning or multi-patterning processes. For example, in one or more embodiments, a sacrificial layer is formed over a substrate and patterned using a photolithography process. Spacers are formed alongside the patterned sacrificial layer using a self-aligned process. The sacrificial layer is then removed, and the remaining spacers are then used to pattern the fins 28 by etching the multilayer structure 22 and the substrate 20. Example etch processes include, but are not limited to, dry etch, wet etch, reactive ion etch (RIE), and/or other suitable processes. In FIG. 1B, two fins 28 are illustrated; however, the number of the fins is not limited to two. The fins 28 extend, or are elongated, along the X axis.

A shallow trench isolation (STI) 32 of an insulating material is formed over the substrate 20 and in trenches (not numbered) between the fins 28. For example, the insulating material is deposited over the substrate 20 and the fins 28. Example insulating materials of the STI 32 include, but are not limited to, silicon oxide, fluorine-doped silicate glass (FSG), silicon nitride, silicon oxynitride (SiON), SiOCN, SiCN, a low-k dielectric material, or the like. The deposition of the insulating material includes a suitable method, such as low-pressure chemical vapor deposition (LPCVD), plasma enhanced CVD (PECVD) or flowable CVD (FCVD). Then, a planarization operation, such as a chemical mechanical polishing (CMP) process and/or an etch-back process, is performed such that the tops of the fins 28 are exposed from the insulating material. A portion of the insulating material between adjacent fins 28 is removed. The remaining portion of the insulating material configures the STI 32. The partial removal of the insulating material includes dry etch, wet etch, or the like.

A sacrificial gate dielectric layer 36, a sacrificial gate electrode layer 38, and a mask structure 40 are deposited over the STI 32 and fins 28. The sacrificial gate dielectric layer 36 comprises one or more layers of dielectric material, such as SiO2, SiN, a high-k dielectric material, and/or other suitable dielectric material. In some embodiments, the sacrificial gate dielectric layer 36 is deposited by a CVD process, a sub-atmospheric CVD (SACVD) process, a FCVD process, an atomic layer deposition (ALD) process, a physical vapor deposition (PVD) process, or other suitable process. In at least one embodiment, the sacrificial gate electrode layer 38 comprises polycrystalline silicon (polysilicon). In some embodiments, the mask structure 40 comprises a multilayer structure. In some embodiments, the sacrificial gate electrode layer 38 and the mask structure 40 are formed by one or more processes such as layer deposition, for example, CVD (including both LPCVD and PECVD), PVD, ALD, thermal oxidation, e-beam evaporation, or other suitable deposition techniques. A structure 100B is obtained.

Figure 1C:
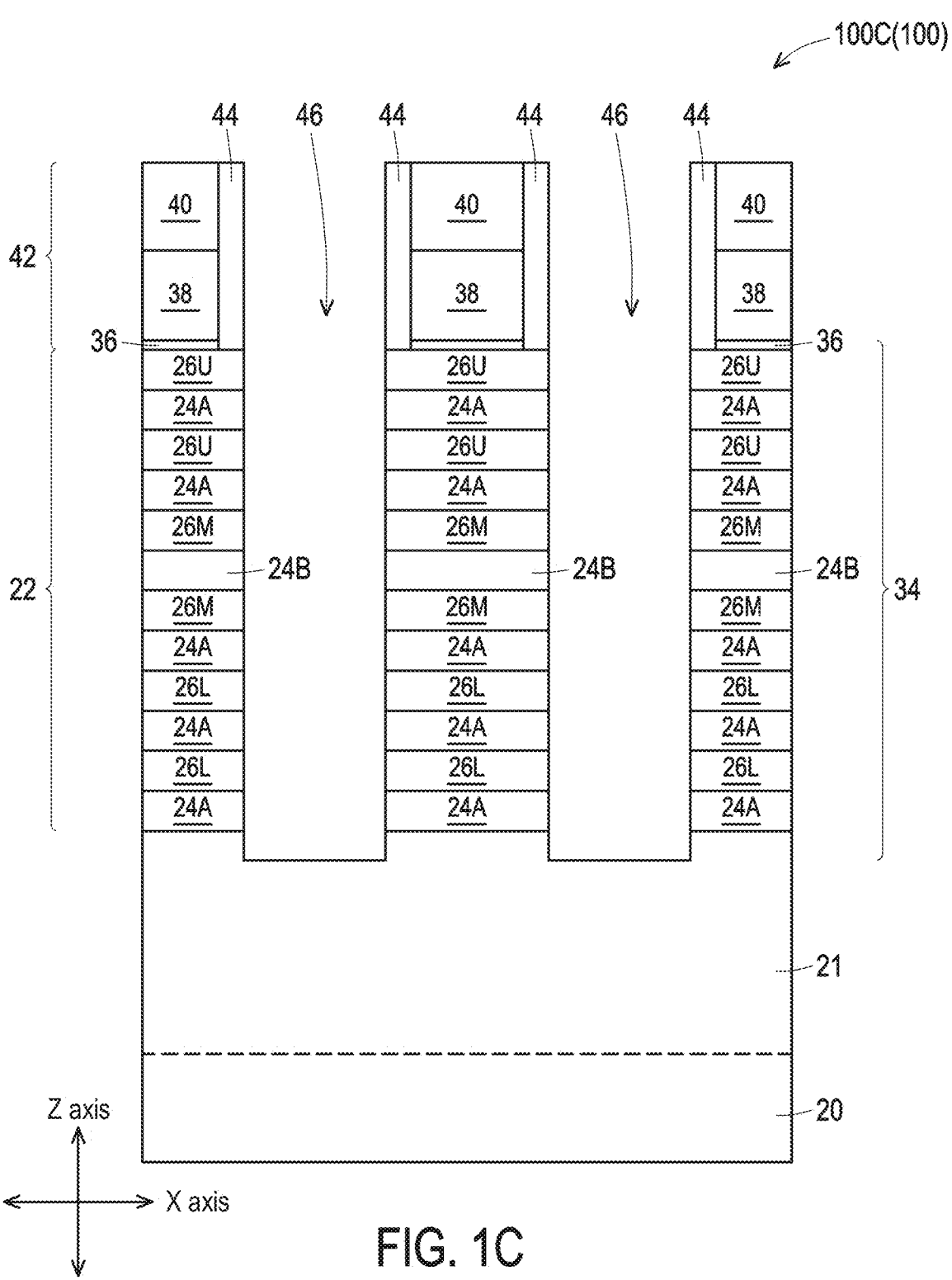
FIGS. 1C-1F are schematic cross-sectional views of an IC device at various stages in a manufacturing process, in accordance with some embodiments.

Referring to FIG. 1C, sacrificial gate stacks 42 are formed by one or more pattern and/or etch processes performed on the deposited sacrificial gate dielectric layer 36, sacrificial gate electrode layer 38, and mask structure 40 of the structure 100B. An example pattern process comprises a lithography process. An example etch process comprises dry etch (e.g., RIE), wet etch, other etch methods, and/or combinations thereof. Each sacrificial gate stack 42 comprises a portion of each of the sacrificial gate dielectric layer 36, sacrificial gate electrode layer 38, and mask structure 40. The sacrificial gate stacks 42 extend, or are elongated, along the Y axis. In FIG. 1C, three sacrificial gate stacks 42 are illustrated; however, the number of the sacrificial gate stacks 42 is not limited to two.

Spacers 44 are formed on sidewalls of the sacrificial gate stacks 42. For example, the spacers 44 are formed by first depositing a conformal layer that is subsequently etched back to form the spacers 44. The spacers 44 comprises a dielectric material, such as silicon oxide, silicon nitride, silicon carbide, silicon oxynitride, SiCN, silicon oxycarbide, SiOCN, and/or combinations thereof. In some embodiments, the spacers 44 comprise multiple layers.

Exposed portions of the stacks of semiconductor layers 34 of the fins 28 not covered by the sacrificial gate stacks 42 and the spacers 44 are selectively removed, e.g., by one or more suitable etch processes, such as dry etch, wet etch, or a combination thereof, to form trenches 46. In FIG. 1C, a lower most one of the second semiconductor layers 26U and an uppermost one of the second semiconductor layers 26L are designated as middle second semiconductor layers 26M which sandwich therebetween a middle first semiconductor layer 24B. The middle second semiconductor layers 26M and the middle first semiconductor layer 24B are not configured to form channel regions of the top semiconductor device 10U and bottom semiconductor device 10L. Edge portions of the first semiconductor layers 24A, 24B and second semiconductor layers 26U, 26L, 26M are exposed in the trenches 46. The trenches 46 also expose portions of the substrate portion 21. A structure 100C is obtained.

Figure 1D:
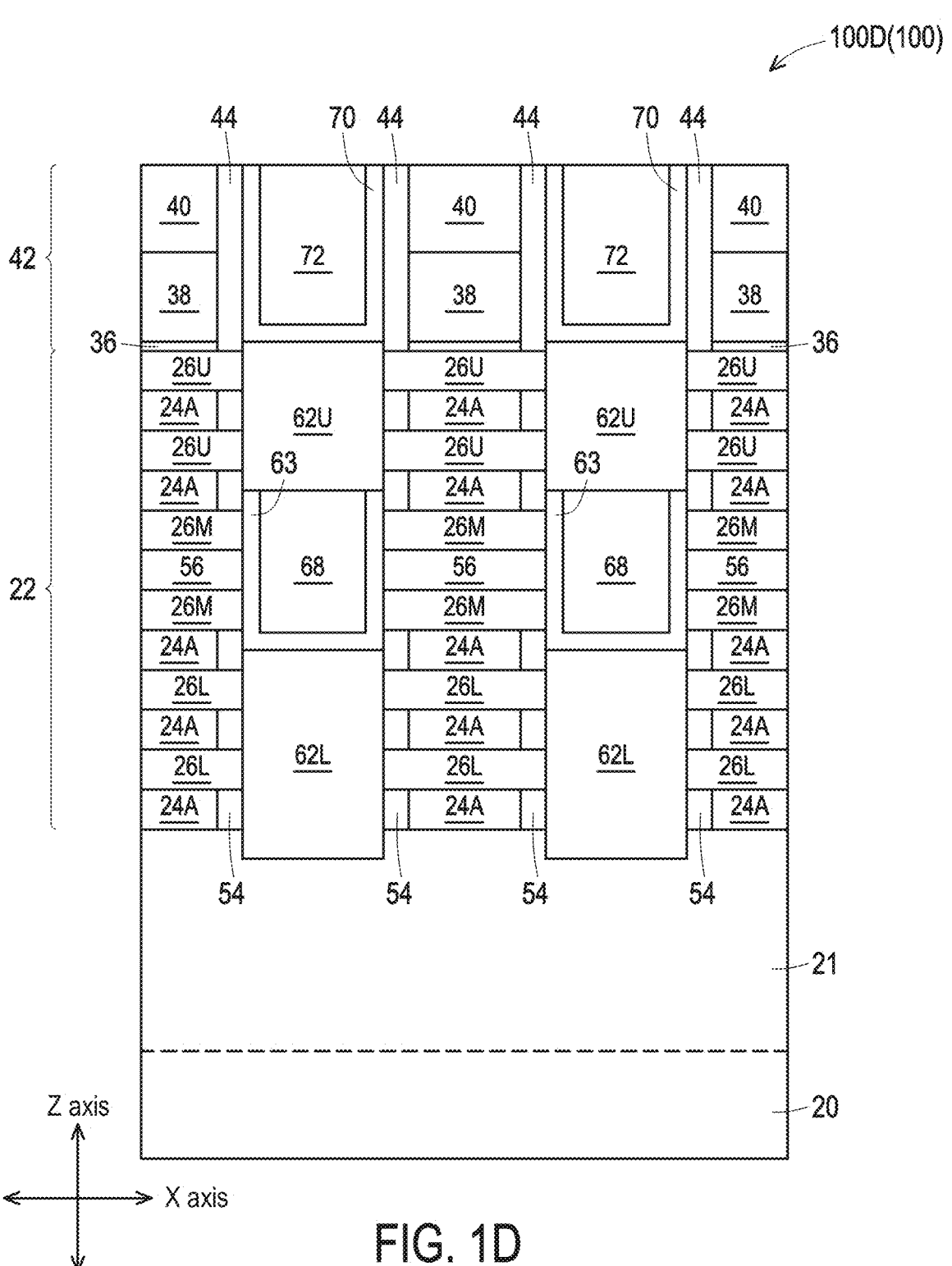

Referring to FIG. 1D, the exposed edge portions of the first semiconductor layers 24A are removed. In some embodiments, the removal comprises a selective wet etch process. The selective wet etch process further completely (or substantially completely) removes the first semiconductor layer 24B in the middle of the stack of semiconductor layers 34. For example, in embodiments where the first semiconductor layers 24A, 24B comprise SiGe, and the second semiconductor layers 26U, 26L, 26M comprise Si, a selective wet etch is configured to etch the first semiconductor layer 24B at a highest etch rate, the first semiconductor layers 24A at a second highest etch rate, and the second semiconductor layers 26U, 26L, 26M at a slowest etch rate. As a result, the exposed edge portions of the first semiconductor layers 24A and an entirety (or substantially an entirety) of the first semiconductor layer 24B are removed, whereas the second semiconductor layers 26U, 26L, 26M are substantially unchanged.

A dielectric material is deposited over and into the spaces created by the removal of the first semiconductor layer 24B and the partial removal of the edge portions of the first semiconductor layers 24A. The dielectric material filling in the spaces created by the partial removal of the edge portions of the first semiconductor layers 24A configures inner spacers 54. The dielectric material filling in the space created by the removal of the first semiconductor layer 24B configures an inner isolation structure 56. Examples of the dielectric material forming the inner spacers 54 and inner isolation structure 56 include, but are not limited to, a low-k dielectric material, such as SiO2, SiN, SiCN, SiOC, or SiOCN, or a high-k dielectric material, such as HfO2, ZrOx, ZrAlOx, HfAlOx, HfSiOx, AlOx, or other suitable dielectric material. In some embodiments, the inner spacers 54 and inner isolation structure 56 comprise different dielectric materials. In an example process, the inner spacers 54 and inner isolation structure 56 are formed by depositing a conformal layer of the dielectric material, using a conformal deposition process, such as ALD, followed by an anisotropic etching to remove portions of the conformal layer other than the inner spacers 54 and inner isolation structure 56.

Source/drain 62L are formed over, and in contact with, the exposed portions of the substrate portions 21, and exposed edge portions of the second semiconductor layers 26L. In the example configuration in FIG. 1D, the source/drains 62L comprise epitaxy structures and are sometimes referred to as source/drain epitaxy structures 62L. In some embodiments, the source/drain epitaxy structures 62L comprise one or more layers of Si, SiP, SiC and SiCP to configure an N-type bottom semiconductor device. In some embodiments, the source/drain epitaxy structures 62L comprise one or more layers of Si, SiGe, Ge to configure a P-type bottom semiconductor device. Example epitaxial growth processes for growing the source/drain epitaxy structures 62L include, but are not limited to, CVD, ALD, MBE. In some embodiments, source/drain epitaxy structures 62L are grown to a height above the uppermost second semiconductor layer 26L, and then top portions of the source/drain epitaxy structures 62L are partially removed, e.g., by a dry etch or wet etch, so that upper surfaces of the remaining source/drain epitaxy structures 62L are at a level of the uppermost first semiconductor layer 24A immediately under the lower middle second semiconductor layer 26M, as illustrated in FIG. 1D.

A liner 63 is formed at least over the upper surfaces of the source/drain epitaxy structures 62L, and exposed side faces of the middle second semiconductor layers 26M, inner isolation structure 56. In some embodiments, the liner 63 comprises Si. In an example process, the liner 63 is a conformal layer formed by a conformal process, such as an ALD process.

A dielectric material 68 is formed over the liner 63 and over the source/drain epitaxy structures 62L. In some embodiments, the dielectric material 68 comprises the same material as the STI 32 and/or is formed by the same method as the STI 32. The liner 63 and dielectric material 68 are removed outside the trenches 46, and partially removed inside the trenches 46, e.g., by a dry etch or wet etch. As a result, upper surfaces of the liner 63 and dielectric material 68 are at a level of the lowermost first semiconductor layer 24A immediately above the upper middle second semiconductor layer 26M, as illustrated in FIG. 1D. The liner 63 and dielectric material 68 configure an isolation structure between the source/drain 62L and source/drains 62U to be subsequently formed thereover.

Source/drain 62U are formed over, and in contact with, the upper surfaces of the liner 63 and dielectric material 68, and exposed edge portions of the second semiconductor layers 26U. In the example configuration in FIG. 1D, the source/drains 62U comprise epitaxy structures and are sometimes referred to as source/drain epitaxy structures 62U. The source/drain epitaxy structures 62U are of the same conductivity type as the source/drain epitaxy structures 62L. In some embodiments, the source/drain epitaxy structures 62U comprise the same material and/or are manufactured by the same manufacturing processes as the source/drain epitaxy structures 62L. In at least one embodiment, the source/drain epitaxy structures 62U have the same configuration, e.g., the same size, shape, height, material, as the source/drain epitaxy structures 62L. In an example, where the source/drain epitaxy structures 62L comprise one or more layers of Si, SiP, SiC and SiCP to configure an N-type bottom semiconductor device, the source/drain epitaxy structures 62U comprise one or more layers of Si, SiP, SiC and SiCP to configure an N-type top semiconductor device. In another example, where the source/drain epitaxy structures 62L comprise one or more layers of Si, SiGe, Ge to configure a P-type bottom semiconductor device, the source/drain epitaxy structures 62U comprise one or more layers of Si, SiGe, Ge to configure a P-type top semiconductor device. In some embodiments, source/drain epitaxy structures 62U are grown to a height above the sacrificial gate dielectric layer 36, and then top portions of the source/drain epitaxy structures 62U are partially removed, e.g., by a dry etch or wet etch, so that upper surfaces of the remaining source/drain epitaxy structures 62U are at a level of the sacrificial gate dielectric layer 36, as illustrated in FIG. 1D. This is an example, and a height of the source/drain epitaxy structures 62U is controllable depending on application and/or process requirements.

A contact etch stop layer (CESL) 70 is formed over the source/drain epitaxy structures 62U. Example materials of the CESL 70 include, but are not limited to, silicon nitride, silicon carbon nitride, silicon oxynitride, carbon nitride, silicon oxide, silicon carbon oxide, the like, or a combination thereof. The CESL 70 is formed by CVD, PECVD, ALD, or any suitable deposition technique.

An interlayer dielectric (ILD) layer 72 is formed over the CESL 70. Example materials of the ILD layer 72 include, but are not limited to, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 72 is deposited by a PECVD process or other suitable deposition technique. A structure 100D is obtained.

Figure 1E:
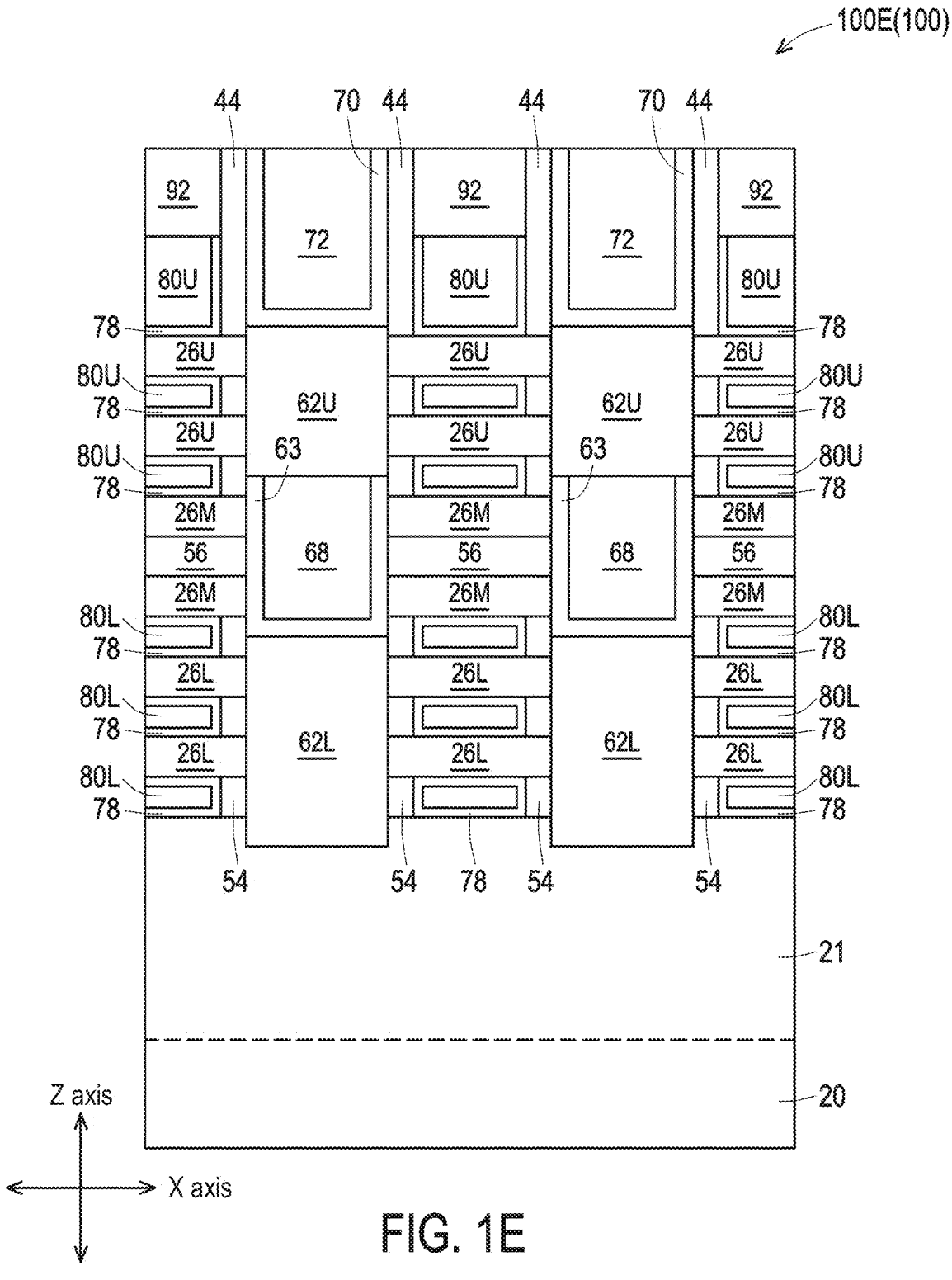

Referring to FIG. 1E, a planarization process, such as a CMP process, is performed to remove the mask structure 40 and expose the sacrificial gate electrode layer 38. The planarization process also removes portions of the ILD layer 72 and the CESL 70.

The exposed sacrificial gate electrode layer 38 and the sacrificial gate dielectric layer 36 are removed, e.g., by one or more suitable processes, such as dry etch, wet etch, or a combination thereof.

Next, the first semiconductor layers 24A are removed, e.g., by any suitable processes, such as dry etch, wet etch, or a combination thereof. The removal of the first semiconductor layers 24A exposes the inner spacers 54 and the second semiconductor layers 26U, 26L, and creates spaces between and around exposed portions of the second semiconductor layers 26U, 26L not covered by the inner spacers 54. The exposed portions of the second semiconductor layers 26U, 26L configure the nanosheets 26U, 26L described with respect to FIG. 1A. The middle second semiconductor layers 26M and inner isolation structure 56 are covered by the liner 63 and dielectric material 68, and are substantially unaffected by the removal of the first semiconductor layers 24A.

A gate dielectric layer 78 is formed over and around each of the nanosheets 26U, 26L. In some embodiments, the gate dielectric layer 78 comprises the same material as the sacrificial gate dielectric layer 36. In some embodiments, the gate dielectric layer 78 comprises a high-k dielectric material. In some embodiments, the gate dielectric layer 78 is formed by a conformal process, such as an ALD process.

A gate electrode material is formed over and around the gate dielectric layers 78, and the nanosheets 26U, 26L. The gate electrode material surrounding each of the nanosheets 26U configures the gate 80U. The gate electrode material surrounding each of the nanosheets 26L configures the gate 80L. In some embodiments, the gate electrode material comprises multiple gate electrode layers. Example gate electrode materials include, but are not limited to, polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode material comprises a P-type gate electrode layer, such as TiN, TaN, TiTaN, TiAlN, WCN, W, Ni, Co, or other suitable material, for configuring P-type top and bottom semiconductor devices. In at least one embodiment, the gate electrode material comprises an N-type gate electrode layer, such as TiAlC, TaAlC, TiSiAlC, TiC, TaSiAlC, or other suitable material, for configuring N-type top and bottom semiconductor devices. Example processes for depositing the gate electrode material include, but are not limited to, PVD, CVD, ALD, electro-plating, or other suitable methods.

In some embodiments, each of the gate 80U and gate 80L comprises a corresponding GAA structure, and the gate 80U and gate 80L are physically and electrically separated from each other by the middle second semiconductor layers 26M and inner isolation structure 56. In some embodiments, a combination of the middle second semiconductor layers 26M and inner isolation structure 56 corresponds to the intermediate layer 90 being a dielectric material in an isolated gate configuration. In at least one embodiment, the gate 80U and the gate 80L in an isolated gate configuration are still electrically coupled to each other by a conductor, e.g., an MGLI interconnect. In some embodiments, the gate 80U and gate 80L are integral parts of a GAA structure which extends around each of the nanosheets 26U, 26L, and configures a common gate for both top semiconductor device and bottom semiconductor device. The formation of the gate 80U and gate 80L completes the formation of the top semiconductor device 10U and bottom semiconductor device 10L.

An ILD layer 92 similar to the ILD layer 72 is deposited over the gate 80U, and a planarization process, such as a CMP, is performed. A structure 100E is obtained.

Figure 1F:
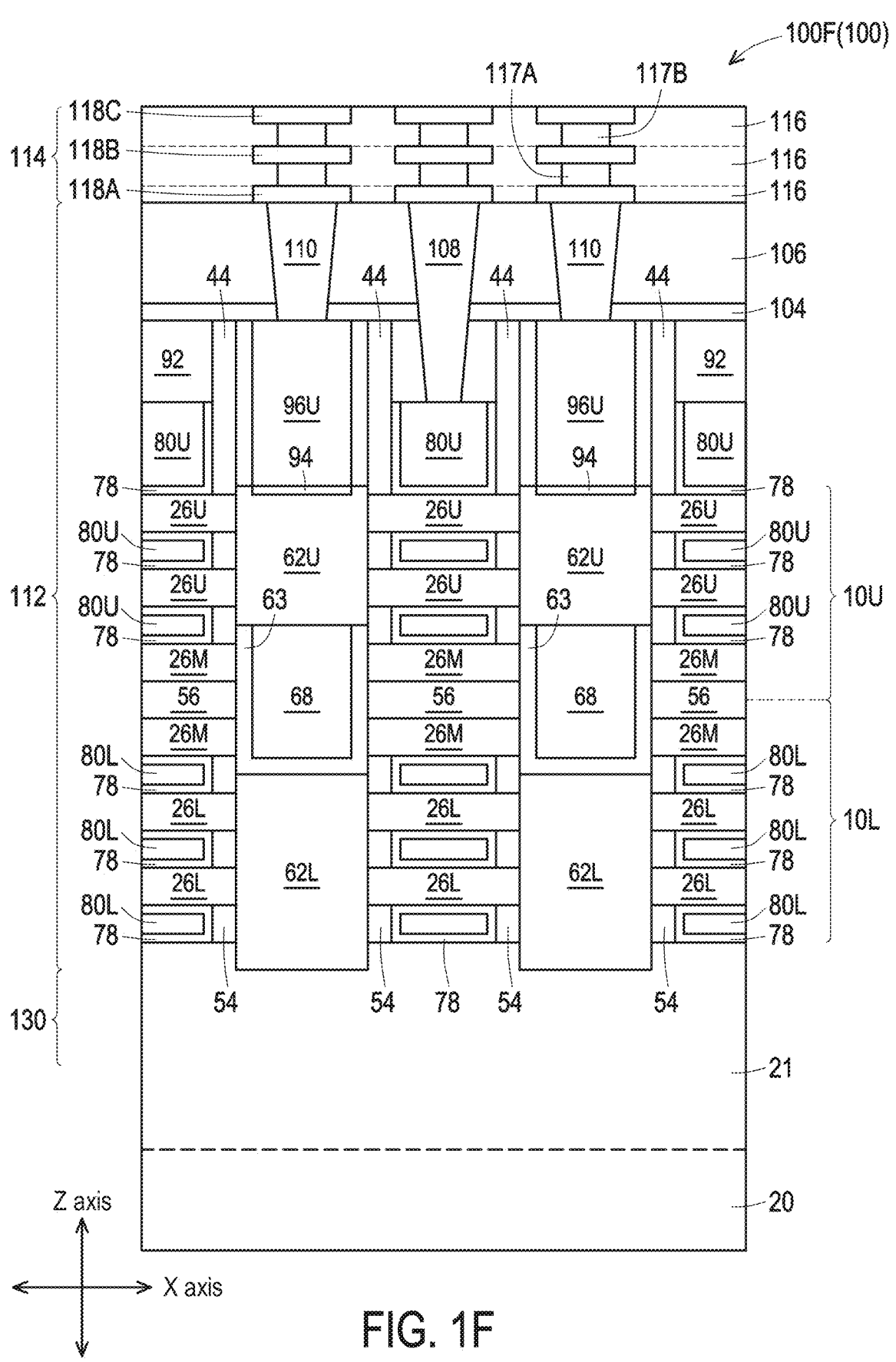

Referring to FIG. 1F, openings are formed in the ILD layer 72 to expose the source/drain epitaxy structures 62U. A silicide layer 94 is formed over the exposed source/drain epitaxy structures 62U, and then source/drain contacts 96U are form in each opening and over the silicide layer 94. Source/drain contacts are sometimes referred to as metal-to-device (MD) contacts. Source/drain contacts of top semiconductor devices are sometimes referred to as MD contacts. Source/drain contacts of bottom semiconductor devices are sometimes referred to as BMD contacts. For simplicity, an MD contact herein refers to either an MD contact at the upper layer or a BMD contact at the lower layer, unless specified otherwise. Example materials of the source/drain contacts 96U include, but are not limited to, Ru, Mo, Co, Ni, W, Ti, Ta, Cu, Al, TiN and TaN. The source/drain contacts 96U are formed by any suitable process, such as PVD, ECP, or CVD.

Dielectric layers 104, 106 are deposited over the MD contacts 96U and ILD layer 92. Various vias 108, 110 are formed by etching via openings in the dielectric layers 104, 106 and ILD layer 92, and then filling the via openings with a conductive material, such as a metal. A via over and in electrical contact with an MD contact is sometimes referred to as via-to-device (VD) via. A via over and in electrical contact with a gate is sometimes referred to as via-to-gate (VG) via. In the example configuration in FIG. 1F, the via 108 is a VG via which is over the gate 80U, and the vias 110 are VD vias correspondingly over the MD contacts 96U. VG and VD vias for bottom semiconductor devices are sometimes correspondingly referred to as BVG and BVD vias.

In some embodiments, the formation of the VG, VD vias completes a front-end-of-line (FEOL) fabrication. A resulting FEOL structure 112 comprising various semiconductor devices formed over a front side (or upper side) of the substrate 20 and the corresponding MD contacts, VG and VD vias is obtained. The FEOL fabrication is followed by a Back End of Line (BEOL) fabrication to provide routing for the semiconductor devices.

The BEOL fabrication comprises forming a redistribution structure 114 over the VD, VG vias 110, 108. The redistribution structure 114 comprises a plurality of metal layers 118A-118C and via layers 117A, 117B sequentially and alternatingly formed over the VD, VG vias 110, 108. The redistribution structure 114 further comprises various interlayer dielectric (ILD) layers 116 in which the metal layers and via layers are embedded. The metal layers and via layers of the redistribution structure 114 are configured to electrically couple various semiconductor devices, or circuits of the IC device 100 with each other, and/or with external circuitry. In the redistribution structure 114, the lowermost metal layer 118A immediately over and in electrical contact with the VD, VG vias 110, 108 is an M0 (metal-zero) layer, a next metal layer 118B immediately over the M0 layer is an M1 layer, a next metal layer 118C immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couple the Mn layer and the Mn+1 layer, where n is an integer from zero and up. For example, the via layer 117A is a via-zero (V0) layer which is the lowermost via layer arranged between and electrically couple the M0 layer 118A and the M1 layer 118B. The next via layer 117B is a V1 layer which is the via layer arranged between and electrically couple the M1 layer 118B and the M2 layer 118C. Vias in the V0 layer are referred to as V0 vias, vias in the V1 layer are referred to as V1 vias, or the like. For simplicity, metal layers and via layers in the redistribution structure 114 are not fully illustrated in FIG. 1F. The redistribution structure 114 and interconnects therein are formed over the front side of the substrate 20, and are sometimes referred to as the front side redistribution structure and front side interconnects. A structure 100F is obtained, as illustrated in FIG. 1F.

In some embodiments, the BEOL fabrication of the IC device 100 further comprises forming a back side redistribution structure (not shown) and corresponding back side interconnects on the back side (e.g., the lower side in FIG. 1F) of the substrate 20. An example back side redistribution structure is described with respect to FIGS. 2C, 2D. In an example manufacturing process, the structure 100F is flipped over and temporarily bonded to a carrier (not shown). Wafer thinning is performed from the back side (now facing upward) to remove a portion of the substrate 20. For example, as illustrated in FIG. 1F, a substrate portion 130 of the substrate 20 remains as a result of the wafer thinning on the back side. In some embodiments, the wafer thinning process includes a grinding operation, a polishing operation (such as, chemical mechanical polishing (CMP)), or the like. In at least one embodiment, the substrate 20 is completely removed, and a new substrate (not shown), e.g., an insulation substrate, is formed over the bottom semiconductor device 10L.

A back side redistribution structure is formed, in a manner similar to the redistribution structure 114, over the remaining substrate portion 130 or the new substrate. The back side redistribution structure comprises various back side metal layers and various back side via layers arranged alternatingly in the thickness direction, i.e., along the Z axis. The back side redistribution structure further comprises various interlayer dielectric (ILD) layers in which the back side metal layers and back side via layers are embedded. The back side metal layer immediately adjacent the bottom semiconductor device 10L is a back side M0 (BM0) layer, a next back side metal layer is a back side M1 (BM1) layer, or the like. A back side via layer BVn is arranged between and electrically couples the BMn layer and the BMn+1 layer, where n is an integer from zero and up. For example, a via layer BV0 is the back side via layer arranged between and electrically couples the BM0 layer and the BM1 layer. Other back side via layers are BV1, BV2, or the like. Conductive patterns in the BM0 layer are referred to as BM0 conductive patterns, conductive patterns in the BM1 layer are referred to as BM1 conductive patterns, or the like. Vias in the BV0 layer are referred to as BV0 vias, vias in the BV1 layer are referred to as BV1 vias, or the like.

In at least one embodiment, one or more advantages described herein are achievable by IC devices comprising device stacks described with respect to FIG. 1A, and/or IC devices manufactured by processes described with respect to FIGS. 1B-1F. Although the described manufacturing processes include formation of nanosheet devices in one or more embodiments, other types of devices, e.g., nanowire, FinFET, planar, or the like, are within the scopes of various embodiments. The described manufacturing processes and/or orders of operations are examples. Other manufacturing processes and/or orders of operations are within the scopes of various embodiments.

Various electrical connections between the top semiconductor device 10U and the bottom semiconductor device 10L, and/or between one or more of the semiconductor devices 10U, 10L and circuit elements outside the device stack 100A are within the scopes of some embodiments. Several example electrical connections are described herein.

Figure 2B:
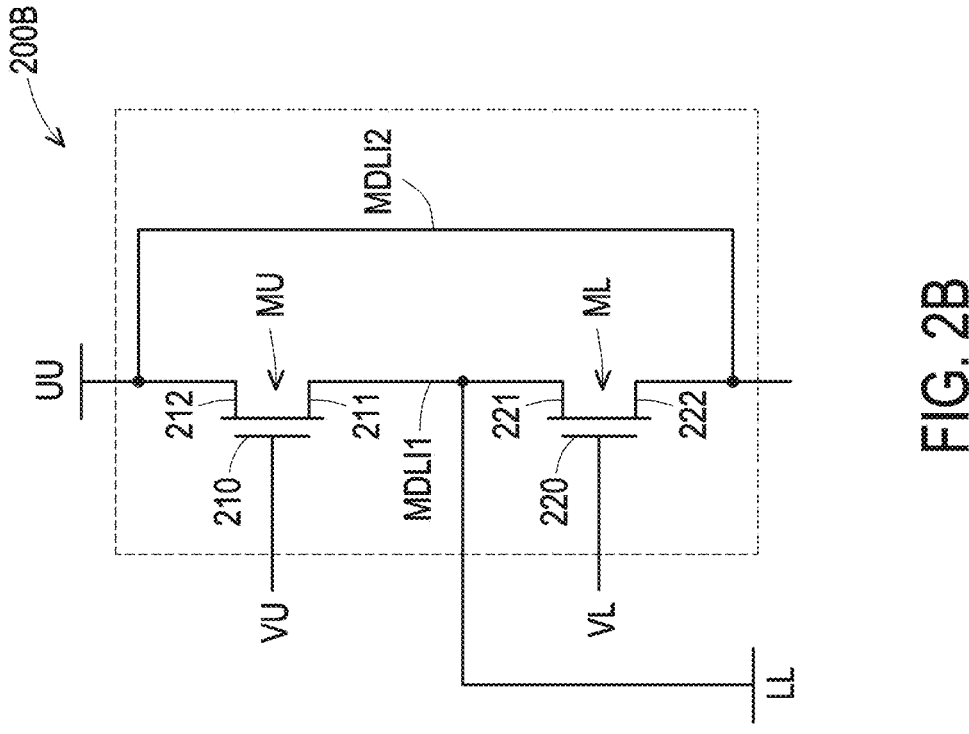
FIGS. 2A and 2B are schematic circuit diagrams.
Figure 2A:
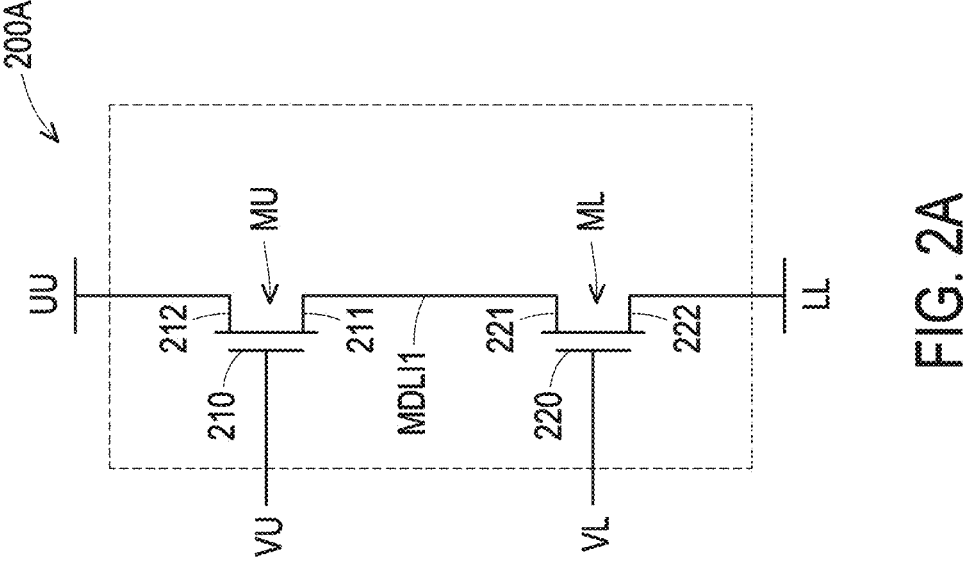

FIG. 2A is a schematic circuit diagram of a device stack 200A, in accordance with some embodiments. In some embodiments, the device stack 200A corresponds to the device stack 100A, and/or is manufactured by one or more processes or operations described with respect to FIGS. 1B-1F.

The device stack 200A comprises a bottom semiconductor device ML, and a top semiconductor device MU stacked over the bottom semiconductor device ML. In some embodiments, the top semiconductor device MU corresponds to the top semiconductor device 10U, and the bottom semiconductor device ML corresponds to the bottom semiconductor device 10L. In the example configuration in FIG. 2A, the top semiconductor device MU and bottom semiconductor device ML are N-type semiconductor devices, e.g., NMOS transistors. The description of the device stack 200A herein is also applicable to embodiments where the top semiconductor device MU and bottom semiconductor device ML are P-type semiconductor devices, e.g., PMOS transistors.

The top semiconductor device MU comprises a gate 210, and source/drains 211, 212. In some embodiments, the gate 210 corresponds to the gate 80U, and the source/drains 211, 212 correspond to the source/drains 62U. The gate 210 is configured to receive an access voltage VU, and the top semiconductor device MU is configured to turn ON in response to application of the access voltage VU to the gate 210. The source/drain 212 is electrically coupled to a node UU.

The bottom semiconductor device ML comprises a gate 220, and source/drains 221, 222. In some embodiments, the gate 220 corresponds to the gate 80L, and the source/drains 221, 222 correspond to the source/drains 62L. The gate 220 is configured to receive an access voltage VL, and the bottom semiconductor device ML is configured to turn ON in response to application of the access voltage VL to the gate 220. The source/drain 222 is electrically coupled to a node LL.

The source/drain 211 of the top semiconductor device MU is electrically coupled to the source/drain 221 of the bottom semiconductor device ML. As a result the top semiconductor device MU and the bottom semiconductor device ML are electrically coupled in series between the node UU and the node LL. In the example configuration in FIG. 2A, the electrical connection between the source/drain 211 and source/drain 221 is implemented by a source/drain local interconnect (MDLI), i.e., interconnect MDLI1. An example configuration of the interconnect MDLI1 is described with respect to FIG. 2C.

In some embodiments, the top semiconductor device MU and bottom semiconductor device ML are independently controllable. For example, the device stack 200A has an isolated gate configuration, and the gates 210, 220 are configured to receive the corresponding access voltages VU, VL independently from each other. In one or more embodiments, the top semiconductor device MU and bottom semiconductor device ML are commonly controllable by a single access voltage. For example, the device stack 200A has a connected gate configuration, and the gates 210, 220 are configured to receive the same access voltage VU or VL. Alternatively, the device stack 200A has an isolated gate configuration, but the gates 210, 220 are nevertheless electrically coupled to each other by a conductor outside the device stack 200A.

In operation, when both the top semiconductor device MU and bottom semiconductor device ML are turned ON, a current flows from the node UU to the node LL, or vice versa. A voltage between the node UU and node LL are applied across both the top semiconductor device MU and bottom semiconductor device ML. This configuration, in one or more embodiments, is advantageous where a nominal operating voltage is too high for a single semiconductor device to handle. Such a situation is potentially met in high voltage applications for core devices. Examples of core devices include, but are not limited to, semiconductor devices or transistors in central processing units (CPUs), logic circuits, or memories. In an IC device, core devices generally have smaller sizes, lower driving strengths, lower operating and breakdown voltages, thinner dielectric layers and/or shorter channels (or fewer fins) than input/output (I/O) devices which are configured to drive long conductor lines and/or off-chip loads. At advanced manufacturing technology nodes, e.g., N5, N3, N2 or the like, core devices have reduced sizes and lowered operating and breakdown voltages. To withstand high operating voltages (e.g., for increased operating/processing speed) and to overcome reliability concerns, core devices are stacked and serially connected, as in the device stack 200A. In some embodiments, the stacked configuration of the top semiconductor device MU and bottom semiconductor device ML in the device stack 200A reduces the required chip area, whereas the serial connection of the top semiconductor device MU and bottom semiconductor device ML permits the semiconductor devices to reliably perform at high operating voltages (e.g., at a core voltage of 1.8 V). In at least one embodiment, further PPA improvements are also achievable.

In some embodiments, the described improvements are further enhanced by electrically coupling more than two semiconductor devices in series. In one or more embodiments, the semiconductor devices in two device stacks 200A are electrically coupled in series, to obtain a circuit of four serially coupled semiconductor devices. In at least one embodiment, the semiconductor devices of one device stack 200A and a top or bottom semiconductor device in another device stack 200A are electrically coupled in series, to obtain a circuit of three serially coupled semiconductor devices. Other configurations are within the scopes of various embodiments.

FIG. 2B is a schematic circuit diagram of a device stack 200B, in accordance with some embodiments. In some embodiments, the device stack 200B corresponds to the device stack 100A, and/or is manufactured by one or more processes or operations described with respect to FIGS. 1B-1F. For simplicity, corresponding components in FIGS. 2A, 2B are designated by the same reference numerals.

Compared to the device stack 200A where the top semiconductor device MU and the bottom semiconductor device ML are electrically coupled in series between the node UU and node LL, the top semiconductor device MU and the bottom semiconductor device ML in the device stack 200B are electrically coupled in parallel between the node UU and node LL. Specifically, the source/drains 211, 221 are electrically coupled by an interconnect MDLI1, as in the device stack 200A. The source/drains 212, 222 are electrically coupled by another interconnect MDLI2. The node LL is electrically coupled to the source/drains 211, 221 and the interconnect MDLI1. The node UU is electrically coupled to the source/drains 212, 222 and the interconnect MDLI2. An example configuration of the interconnect MDLI2 is described with respect to FIG. 2D.

Similarly to the device stack 200A, in the device stack 200B, the top semiconductor device MU and bottom semiconductor device ML are independently controllable by the corresponding access voltages VU, VL, or are commonly controllable by a single access voltage. A current flows between the node UU and node LL when at least one of the top semiconductor device MU or bottom semiconductor device ML is turned ON.

In at least one embodiment, the top semiconductor device MU and bottom semiconductor device ML are commonly controllable by a single access voltage, and when both the top semiconductor device MU and bottom semiconductor device ML are turned ON, about half of the current flowing between the node UU and node LL passes through the top semiconductor device MU, whereas the other half of the current passes through the bottom semiconductor device ML. This configuration, in one or more embodiments, is advantageous where an operating current flowing between the node UU and node LL is too high for a single semiconductor device to handle. Such a situation is potentially met in high current applications for core devices. To withstand a high operating current and to overcome reliability concerns, core devices are stacked and connected in parallel, as in the device stack 200B. In some embodiments, the stacked configuration of the top semiconductor device MU and bottom semiconductor device ML in the device stack 200B reduces the required chip area, whereas the parallel connection of the top semiconductor device MU and bottom semiconductor device ML permits the device stack 200B to pass a high operating current, because only about half of the high operating current flows through each of the top semiconductor device MU and bottom semiconductor device ML. In at least one embodiment, further PPA improvements are also achievable.

In some embodiments, the described improvements are further enhanced by electrically coupling more than two semiconductor devices in parallel. In one or more embodiments, the semiconductor devices in two device stacks 200B are electrically coupled in parallel, to obtain a circuit of four parallelly coupled semiconductor devices. In at least one embodiment, the semiconductor devices of one device stack 200B and a top or bottom semiconductor device in another device stack 200B are electrically coupled in parallel, to obtain a circuit of three parallelly coupled semiconductor devices. Other configurations are within the scopes of various embodiments. In some embodiments, one or more device stack 200A are electrically coupled to one or more device stack 200B, in series and/or in parallel, to obtain a circuit of intended functionality, operating voltage and/or operating current.

Figures 2C, 2D:
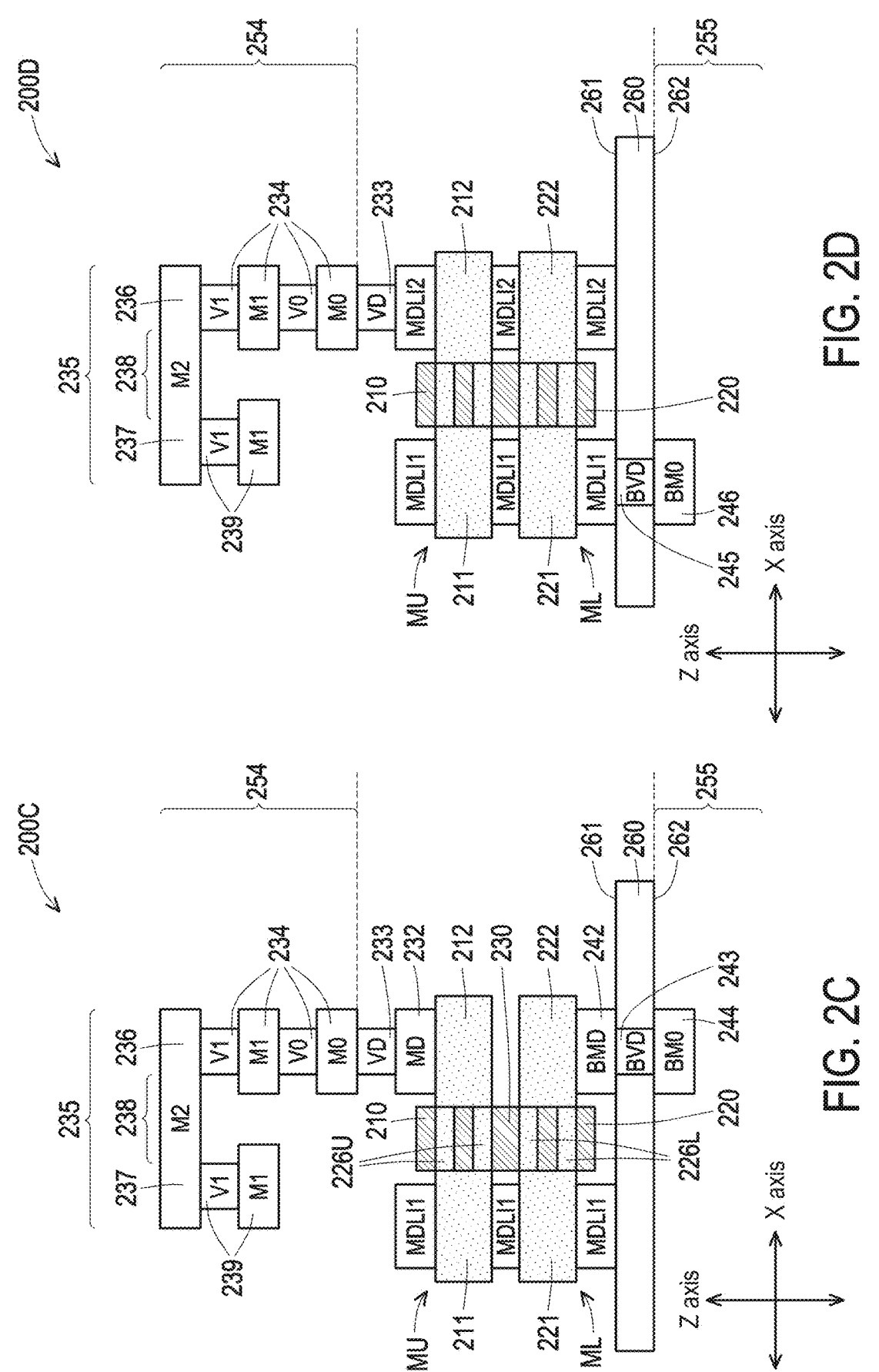
FIGS. 2C and 2D are schematic cross-sectional views.

FIG. 2C is a schematic cross-sectional view of a device stack 200C in an IC device, in accordance with some embodiments. In some embodiments, the device stack 200C corresponds to one or more the device stacks 100A, 200A, and/or is manufactured by one or more processes or operations described with respect to FIGS. 1B-1F. For simplicity, corresponding components in FIGS. 2A, 2C are designated by the same reference numerals.

The IC device in FIG. 2C comprises a substrate 260 having a front side 261, and a back side 262 opposite to the front side 261 in a thickness direction of the substrate 260. In at least one embodiment, the front side 261 is referred to as "first side," "upper side" or "device side," whereas back side 262 is referred to as "second side," or "lower side." The thickness direction of the substrate 260 is also a thickness direction of the IC device. In some embodiments, the substrate 260 corresponds to the substrate portion 130 or an insulation substrate replacing the substrate 20, as described herein.

The device stack 200C is formed over the front side 261 of the substrate 260, and comprises a top semiconductor device MU stacked over the bottom semiconductor device ML. Gates 210, 220 of the top semiconductor device MU and bottom semiconductor device ML extend correspondingly around nanosheets 226U, 226L. In some embodiments, the nanosheets 226U, 226L correspond to the nanosheets 26U, 26L. For simplicity, gate dielectrics are omitted in FIG. 2C. In the example configuration in FIG. 2C, the gates 210, 220 are electrically coupled with each other in a connected gate configuration, by an MGLI interconnect 230. In some embodiments, the MGLI interconnect 230 is a conductor formed by a manufacturing process separate from those for forming the gates 210, 220. In at least one embodiment, the MGLI interconnect 230 is formed together with the gates 210, 220 in the same manufacturing processes for forming the gates 210, 220. In either situation, the gates 210, 220 are electrically coupled into a common gate for both the top semiconductor device MU and bottom semiconductor device ML.

The source/drains 211, 212, 221, 222 are of the same conductivity type. The source/drains 211, 221 are electrically coupled by an interconnect MDLI1. In some embodiments, the interconnect MDLI1 is configured as an MD contact for the source/drain 211 and a BMD contact for the source/drain 221. In some embodiments, a separate MD contact is formed on the source/drain 211, a separate BMD contact is formed on the source/drain 221, and the interconnect MDLI1 is separately formed as a conductor electrically coupling the MD contact on the source/drain 211 to the BMD contact on the source/drain 221. Other configurations are within the scopes of various embodiments.

An MD contact 232 is formed over and in contact with the source/drain 212, and a VD via 233 is formed over and in contact with the MD contact 232. In some embodiments, a VG via (not shown) is formed over and in contact with the gate 210. A BMD contact 242 is formed under and in contact with the source/drain 222, and a BVD via 243 is formed under and in contact with the BMD contact 242. The BVD via 243 extends through the substrate 260, from the front side 261 to the back side 262. In some embodiments, the BVD via 243 is manufactured after flipping over and thinning (or replacing) a substrate as described herein. In some embodiments, a BVG via (not shown) is formed under and in contact with the gate 220. Such a BVG via also extends through the substrate 260.

The IC device further comprises a front side redistribution structure 254 over the VD, VG vias. In some embodiments, the front side redistribution structure 254 corresponds to the redistribution structure 114. In the example configuration in FIG. 2C, the front side redistribution structure 254 comprises a conductive structure 234 formed over and in contact with the VD via 233. The conductive structure 234 comprises an M0 conductive pattern, a V0 via, an M1 conductive pattern, and a V1 via sequentially formed over the VD via 233.

The front side redistribution structure 254 further comprises an M2 conductive pattern 235 having opposite end portions 236, 237, and a middle section 238 between the end portions 236, 237. The end portion 236 is formed over and in contact with the V1 via of the conductive structure 234. The end portion 237 is formed over and in contact with another V1 via of another conductive structure 239. In some embodiments, the M2 conductive pattern 235 comprises a metal fuse which has the middle section 238 configured to be blown to physically and electrically disconnect the end portions 236, 237 from each other, in response to a current of a sufficient level flowing through the metal fuse. In some embodiments, the conductive structure 239 is configured to electrically couple the end portion 237 of the metal fuse to another circuit feature, such as a bit line, as described herein. In at least one embodiment, the metal fuse and/or the conductive structure 239 is/are omitted. In some embodiments, the conductive structure 234 and/or VD via 233 correspond to the node UU in FIG. 2A.

The IC device further comprises a back side redistribution structure 255 under the back side 262 and in contact with the BVD, BVG vias. In the example configuration in FIG. 2C, the back side redistribution structure 255 comprises a BM0 conductive pattern 244 under and in contact with the BVD via 243. In some embodiments, the BVD via 243 and/or BM0 conductive pattern 244 correspond to the node LL in FIG. 2A. In some embodiments, the BM0 conductive pattern 244 comprises a power rail of a power supply voltage, such as the ground voltage (or a reference voltage) VSS when the top semiconductor device MU and bottom semiconductor device ML are N-type transistors, or a positive power supply voltage VDD when the top semiconductor device MU and bottom semiconductor device ML are P-type transistors. The described configuration of the device stack 200C is an example. Other configurations are within the scopes of various embodiments. In at least one embodiment, one or more advantages described herein are achievable by the IC device comprising the device stack 200C.

FIG. 2D is a schematic cross-sectional view of a device stack 200D in an IC device, in accordance with some embodiments. In some embodiments, the device stack 200D corresponds to one or more the device stacks 100A, 200B, and/or is manufactured by one or more processes or operations described with respect to FIGS. 1B-1F. For simplicity, corresponding components in FIGS. 2A, 2C, 2D are designated by the same reference numerals.

Compared to the device stack 200C, the device stack 200D comprises an interconnect MDLI2 instead of the MD contact 232, BMD contact 242. The interconnect MDLI2 is configured similarly to the interconnect MDLI1, and electrically couples the source/drain 212 to the source/drain 222. Further, instead of the BVD via 243, BM0 conductive pattern 244, the IC device in FIG. 2D comprises a BVD via 245 under and in contact with the interconnect MDLI1, and a BM0 conductive pattern 246 under and in contact with the BVD via 245. In some embodiments, the conductive structure 234 and/or VD via 233 correspond to the node UU in FIG. 2B, and the BVD via 245 and/or BM0 conductive pattern 246 correspond to the node LL in FIG. 2B. In some embodiments, both electrical connections to the interconnects MDLI1, MDLI2 are on the front side, or both electrical connections to the interconnects MDLI1, MDLI2 are on the back side of the substrate 260. Other configurations are within the scopes of various embodiments. In at least one embodiment, one or more advantages described herein are achievable by the IC device comprising the device stack 200D.

Figure 2F:
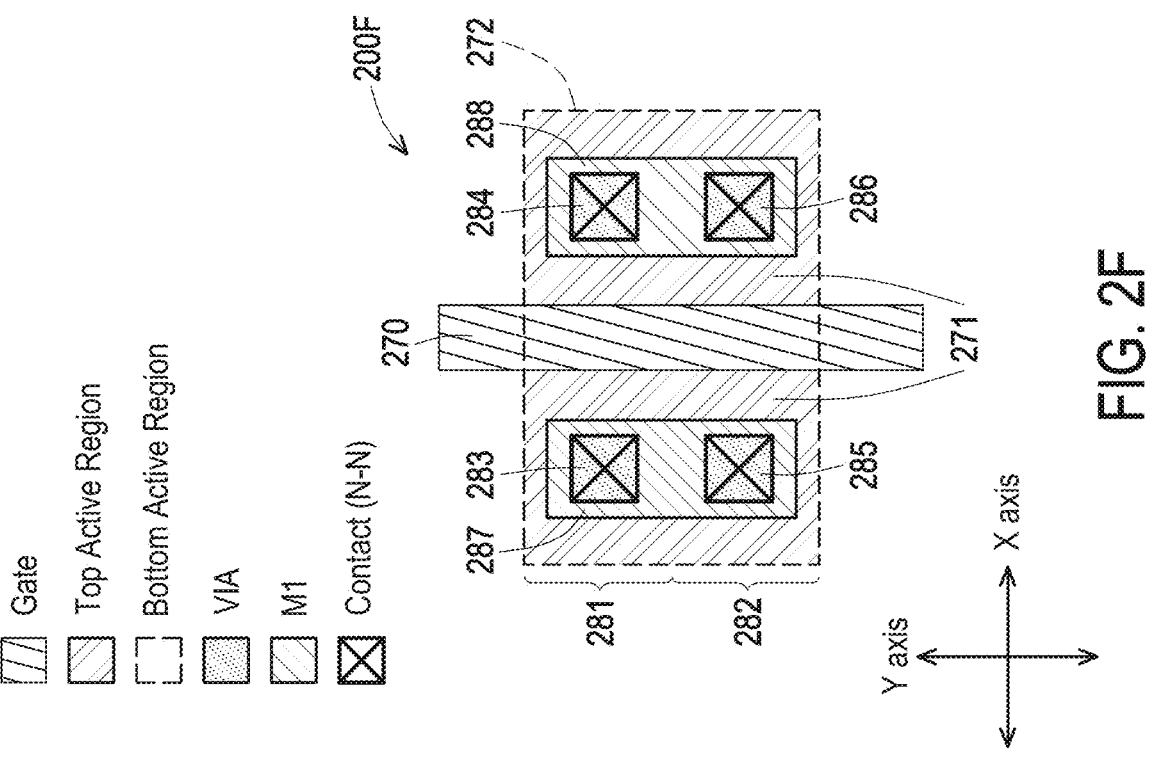
FIGS. 2E and 2F are layout diagrams of various stacks of semiconductor devices, in accordance with some embodiments.
Figure 2E:
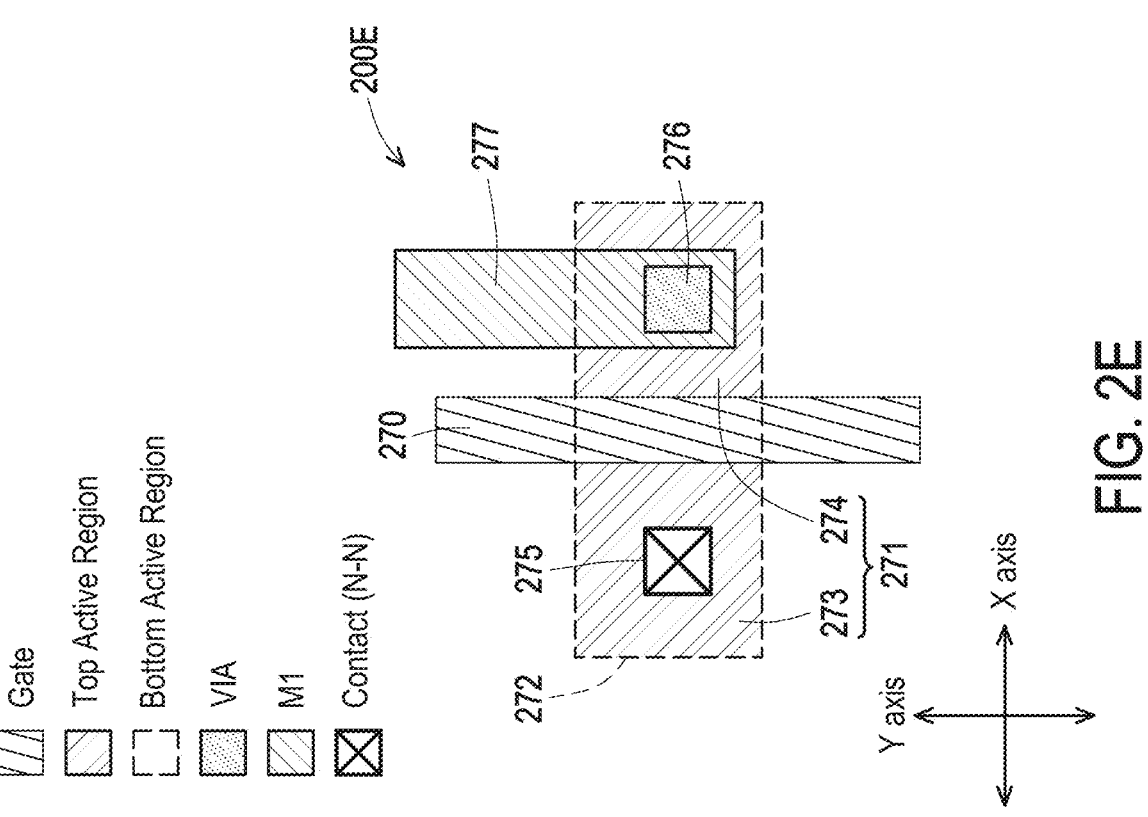

FIG. 2E is a layout diagram 200E of a device stack, in accordance with some embodiments. In some embodiments, the device stack represented by the layout diagram 200E corresponds to one or more the device stacks 100A, 200A, 200C and/or is manufactured by one or more processes or operations described with respect to FIGS. 1B-1F.

The layout diagram 200E comprises a gate region 270, a top active region 271, and a bottom active region 272. The gate region 270 extends along the Y axis, and across the active regions 271, 272. In some embodiments, the gate region 270 corresponds to the gates 210, 220. The active regions 271, 272 extend along the X axis, and comprise source/drain regions which, in one or more embodiments, correspond to various source/drains and/or epitaxy structures described herein. For example, the top active region 271 comprises source/drain regions 273, 274 which, in some embodiments, correspond to the source/drains 211, 212. The bottom active region 272 has the same configuration, e.g., size, shape, conductivity type as the top active region 271, and comprises source/drain regions (not shown) which, in some embodiments, correspond to the source/drains 221, 222. The gate region 270 configures a top semiconductor device with the top active region 271, and a bottom semiconductor device with the bottom active region 272.

The layout diagram 200E further comprises a local interconnect 275 represented by a label "contact N-N" in the drawing. The label "contact N-N" corresponds to the device stack comprising an N-on-N structure. In at least one embodiment, where the device stack comprises a P-on-P structure, the local interconnect 275 is labeled as a contact P-P. The local interconnect 275 electrically couples the source/drain region 273 to the corresponding, underlying source/drain region of the bottom active region 272. In some embodiments, the local interconnect 275 corresponds to the interconnect MDLI1. The top semiconductor device and bottom semiconductor device in the layout diagram 200E are electrically coupled in series and share a common gate represented by the gate region 270, similarly to the device stack 200C.

The layout diagram 200E further comprises a via 276 and an M1 conductive pattern 277 electrically coupled to the source/drain region 274. For simplicity, the via 276 represents an MD contact, a VD via, an M0 conductive pattern, and a V0 via between the source/drain region 274 and the M1 conductive pattern 277. In some embodiments, the M1 conductive pattern 277 corresponds to the node UU in FIG. 2A. In some embodiments, the layout diagram 200E further comprises back side conductive features, e.g., a BMD contact, a BVD via, a BM0 conductive pattern, or the like, electrically coupled to the source/drain region of the bottom active region 272 under the source/drain region 274. Such back side conductive features, in one or more embodiments, correspond to the node LL in FIG. 2A.

FIG. 2F is a layout diagram 200F of a device stack, in accordance with some embodiments. In some embodiments, the device stack represented by the layout diagram 200F corresponds to one or more the device stacks 100A, 200B, 200D and/or is manufactured by one or more processes or operations described with respect to FIGS. 1B-1F. For simplicity, corresponding components in FIGS. 2E, 2F are designated by the same reference numerals Compared to the layout diagram 200E, the layout diagram 200F comprises two device stacks 281, 282. The device stacks 281, 282 are similarly configured. The device stack 281 is described in detail herein. The description of the device stack 281 is applicable to the device stack 282. The device stack 281 is configured similarly to the device stack represented by the layout diagram 200E, with a difference that the top semiconductor device and bottom semiconductor device in the device stack 281 are electrically coupled in parallel. A conductive feature 283 in the layout diagram 200F represents a combination of a local interconnect similar to the local interconnect 275 and a via similar to the via 276. The conductive feature 283 corresponds to an electrical connection of a pair of stacked source/drain regions of the device stack 281 in the active regions 271, 272 to an M1 conductive pattern 287. A conductive feature 284 corresponds to an electrical connection of another pair of stacked source/drain regions of the device stack 281 in the active regions 271, 272 to an M1 conductive pattern 288. A conductive feature 285 corresponds to an electrical connection of a pair of stacked source/drain regions of the device stack 282 in the active regions 271, 272 to the M1 conductive pattern 287. A conductive feature 286 corresponds to an electrical connection of another pair of stacked source/drain regions of the device stack 282 in the active regions 271, 272 to the M1 conductive pattern 288.

In some embodiments, the M1 conductive pattern 287 corresponds to one of the nodes UU, LL in FIG. 2B, and the M1 conductive pattern 288 corresponds to the other of the nodes UU, LL in FIG. 2B. The layout diagram 200F represents four semiconductor devices of the same conductivity type, electrically coupled in parallel, and sharing a common gate represented by the gate region 270. In some embodiments, each of the device stacks 281, 282 corresponds to the device stack 200D. In some embodiments, one of the device stacks 281, 282 is omitted.

In some embodiments, the layout diagram 200E and/or the layout diagram 200F are stored in one or more standard cell libraries and/or on one or more computer-readable recording media. In at least one embodiment, the layout diagram 200E and/or the layout diagram 200F are placed, e.g., by an EDA tool, in a repeated pattern along the X axis and the Y axis, to generate at least a portion of an IC device layout diagram. The IC device layout diagram is subsequently used for manufacturing one or more IC devices including multiple device stacks corresponding to the layout diagram 200E and/or the layout diagram 200F. In at least one embodiment, one or more advantages described herein are achievable by one or more such IC devices.

Various circuits, IC devices, and/or applications including one or more device stacks described with respect to one or more of FIGS. 1A-1F, 2A-2F are within the scopes of various embodiments. Several examples in accordance with some embodiments are described herein with respect to FIGS. 3A-3B, 4A-4C.

Figure 3A:
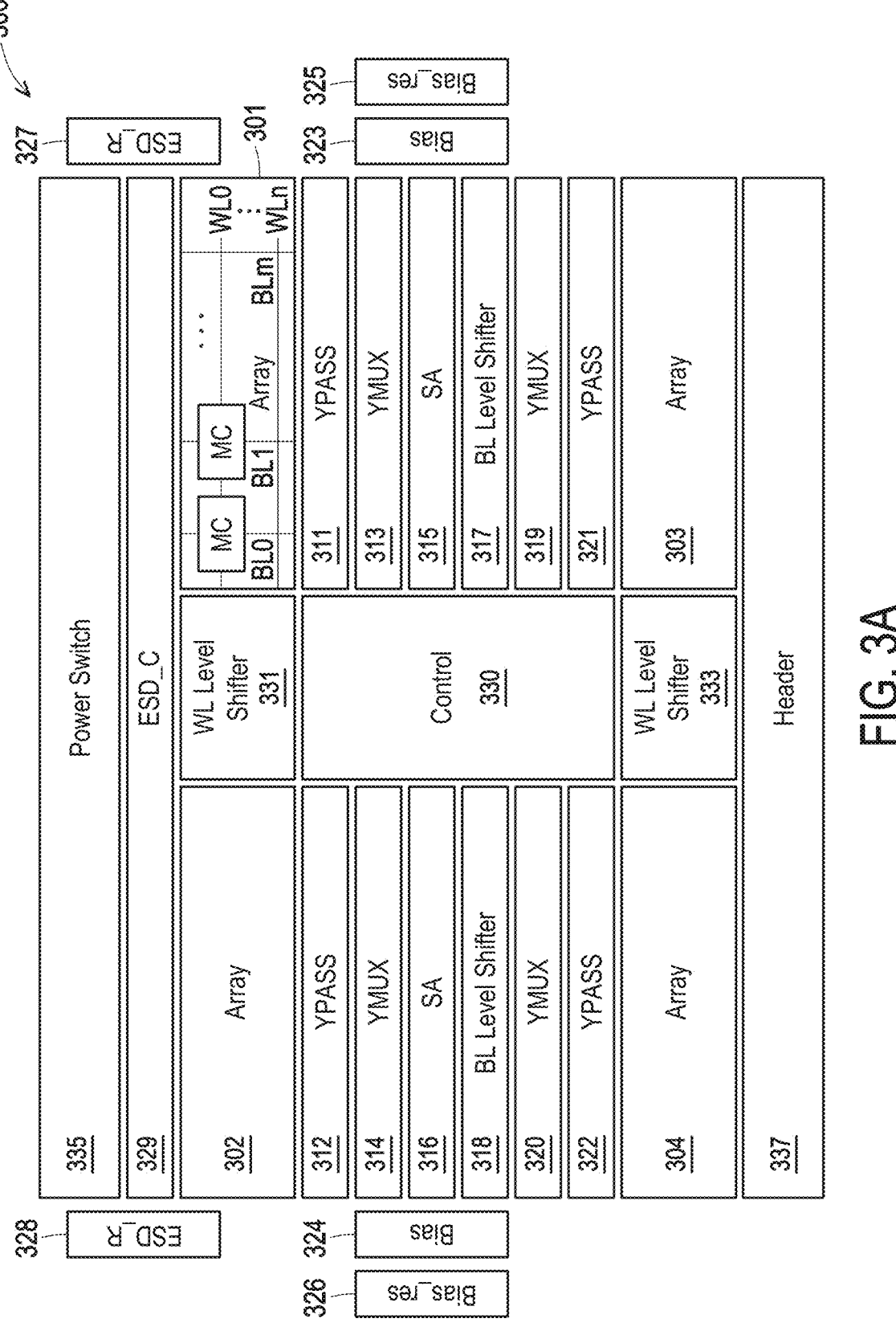
FIG. 3A is a schematic block diagram of a memory device, in accordance with some embodiments.

FIG. 3A is a schematic block diagram of a memory device 300, in accordance with some embodiments. A memory device is a type of an IC device. In at least one embodiment, a memory device is an individual IC device. In some embodiments, a memory device is included as a part of a larger IC device which comprises circuitry other than the memory device for other functionalities. In the example configuration in FIG. 3A, the memory device 300 comprises a One-Time Programmable (OTP) memory device. Other memory types or memory configurations, such as, flash, erasable programmable read only memory (EPROM), or the like, are within the scopes of various embodiments.

The memory device 300 comprises memory arrays 301-304, YPASS circuits 311, 312, 321, 322, YMUX circuits 313, 314, 319, 320, sense amplifiers (SA) 315, 316, bit line (BL) level shifters 317, 318, bias circuits 323, 324, bias resistors 325, 326, electrostatic discharge (ESD) protection circuits 327, 328, 329, a control circuit 330, word line (WL) level shifters 331, 333, a power switch circuit 335, and a header circuit 337. In some embodiments, the bias circuits 323, 324, bias resistors 325, 326, and ESD protection circuits 327, 328 are off-chip circuits. In some embodiments, except for the off-chip circuits and the memory arrays 301-304, the remaining circuits and components are sometimes collectively referred to as a memory controller. Each of the memory arrays 301-304 comprises a plurality of memory cells, a plurality of bit lines (BL), and a plurality of word lines (WL), as described in detail with respect to the memory array 301.

The YPASS circuit 311, YMUX circuit 313, SA 315, BL level shifter 317 are electrically coupled to the memory array 301 by the bit lines of the memory array 301. The YPASS circuit 321, YMUX circuit 319, SA 315, BL level shifter 317 are electrically coupled to the memory array 303 by the bit lines of the memory array 303. The YPASS circuit 312, YMUX circuit 314, SA 316, BL level shifter 318 are electrically coupled to the memory array 302 by the bit lines of the memory array 302. The YPASS circuit 322, YMUX circuit 320, SA 316, BL level shifter 318 are electrically coupled to the memory array 304 by the bit lines of the memory array 304. The WL level shifter 331 is electrically coupled to the memory arrays 301-302 by the word lines of the memory arrays 301-302. The WL level shifter 333 is electrically coupled to the memory arrays 303-304 by the word lines of the memory arrays 303-304. The SA 315 is electrically coupled to the bias circuit 323, and bias resistor 325. The SA 316 is electrically coupled to the bias circuit 324, and bias resistor 326. The power switch circuit 335 is configured to provide power to the YPASS circuits 311, 312, 321, 322, and memory arrays 301-304 in a program operation. The header circuit 337 is configured to provide power to the YMUX circuits 313, 314, 319, 320, SA 315, 316 and memory arrays 301-304 in a read operation. The ESD protection circuits 327, 328, 329 are configured to provide ESD protection for other circuits and components of the memory device 300.

The memory arrays 301-304 are similarly configured. The memory array 301 is described in detail herein. The description of the memory array 301 is applicable to the memory arrays 302-304. The memory array 301 comprises a plurality of memory cells MC, a plurality of word lines WL0 to WLn, and a plurality of bit lines BL0 to BLm, where n and m are natural numbers. In the memory array 301, the memory cells MC are arranged in a plurality of columns corresponding to the bit lines BL0 to BLm, and a plurality of rows corresponding to the word lines WL0 to WLn. Columns and rows in a memory array are sometimes referred to as memory columns and memory rows. Each memory cell MC is electrically coupled to a corresponding word line and a corresponding bit line. In some embodiments, each memory cell MC is electrically coupled to more than one word lines and/or more than one bit lines. The word lines are configured for transmitting addresses of memory cells MC to be accessed in a read operation or program operation. The word lines are sometimes referred to as "address lines." The bit lines are configured for transmitting data read from, or data to be programed into, the memory cells MC indicated by the addresses on the corresponding word lines. The bit lines are sometimes referred to as "data lines." Various numbers of word lines and/or bit lines in the memory array 301 are within the scope of various embodiments.

The WL level shifters 331, 333 are sometimes referred to as word line drivers or word line driving circuits. In some embodiments, the control circuit 330 is configured to decode a row address of one or more memory cells MC selected to be accessed, and to cause the WL level shifters 331, 333 to supply a set of access voltages to the selected word line(s) corresponding to the decoded row address, and a different set of voltages (e.g., zero) to the other, unselected word lines.

The BL level shifters 317, 318 are sometimes referred to as bit line drivers or bit line driving circuits. In some embodiments, the control circuit 330 is configured to decode a column address of one or more memory cells MC selected to be accessed, and to cause the BL level shifters 317, 318 to supply a set of read or program voltages to the selected bit line(s) corresponding to the decoded column address, and a different set of read or program voltages (e.g., zero) to the other, unselected bit lines.

The YMUX circuits 313, 314, 319, 320 are examples of bit line select circuits which, in some embodiments, are configured to selectively couple the selected bit line(s) to the corresponding SA 315, 316 in a read operation.

The YPASS circuits 311, 312, 321, 322, are further examples of bit line select circuits which, in some embodiments, are configured to selectively couple the selected bit line(s) to the power switch circuit 335 in a program operation.

The SAs 315, 316 are configured to sense, and output, data read from the accessed memory cells MC and retrieved through the corresponding bit line(s).

The control circuit 330 is configured to control operations of one or more of the YPASS circuits 311, 312, 321, 322, YMUX circuits 313, 314, 319, 320, sense amplifiers (SA) 315, 316, BL level shifters 317, 318, WL level shifters 331, 333, power switch circuit 335, and header circuit 337.

In at least one embodiment, the memory controller further includes one or more clock generators for providing clock signals for various components of the memory device 300, one or more input/output (I/O) circuits for data exchange with external devices, and/or one or more sub-controllers for controlling various operations in the memory device 300. The described memory device configuration is an example, and other memory device configurations are within the scopes of various embodiments.

In some embodiments, one or more circuits or components of the memory device 300 comprise one or more device stacks as described herein. In an example, at least one of the memory arrays 301-304, YPASS circuits 311, 312, 321, 322, or power switch circuit 335 comprises one or more device stacks as described herein.

Figure 3B:
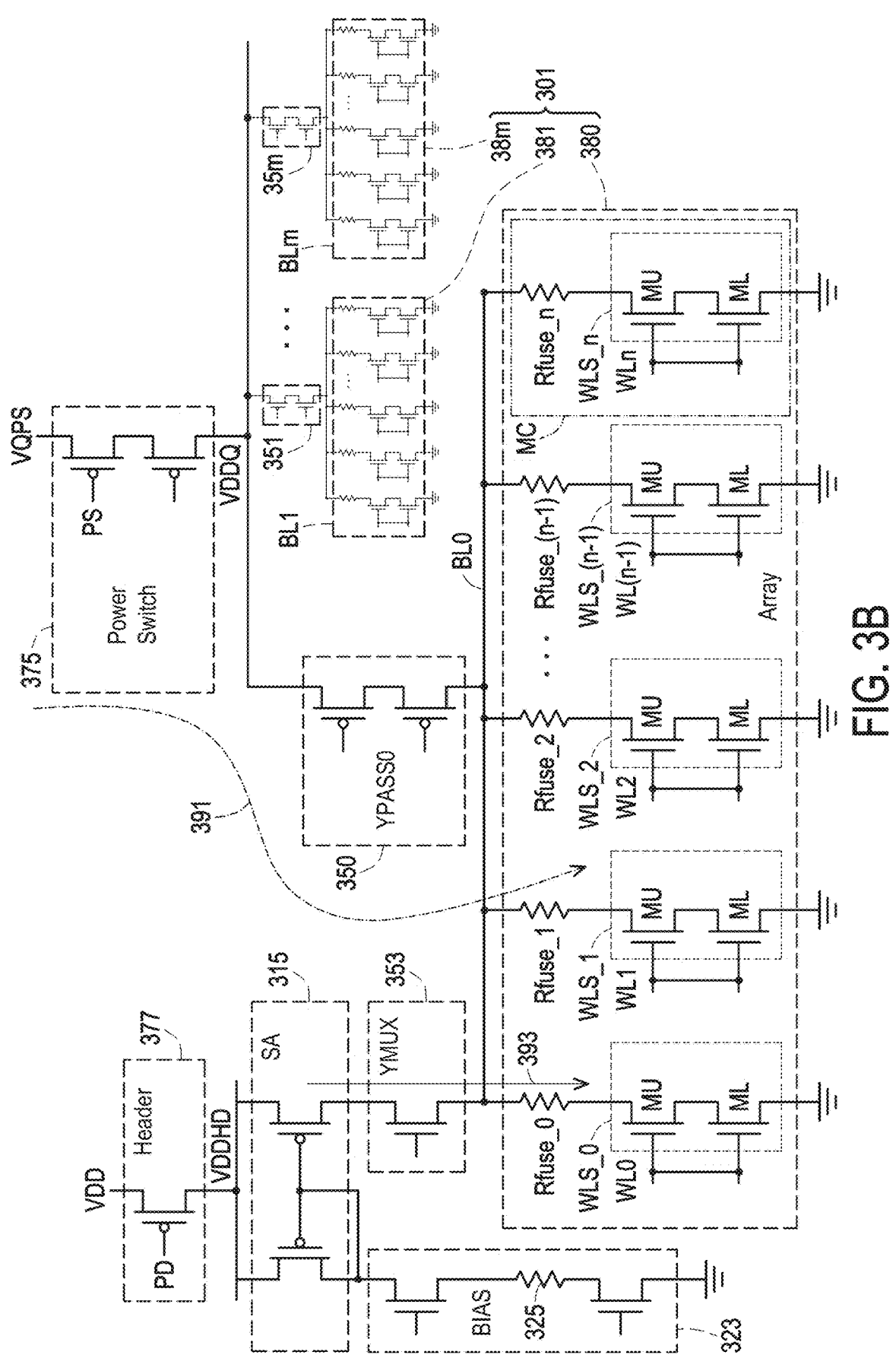
FIG. 3B is a schematic circuit diagram of a segment of a memory device, in accordance with some embodiments.

FIG. 3B is a schematic circuit diagram of a segment of the memory device 300, in accordance with some embodiments. Corresponding components in FIGS. 3A, 3B are designated by the same reference numerals.

In FIG. 3B, memory columns 380, 381 to 38m of the memory array 301 are coupled correspondingly to the bit lines BL0, BL1 to BLm. Bit line select circuits 350, 351 to 35m of the YPASS circuit 311 are also coupled correspondingly to the bit lines BL0, BL1 to BLm. A power switch 375 of the power switch circuit 335 is electrically coupled between a power rail VQPS and a power rail VDDQ to which the bit line select circuits 350, 351 to 35m are electrically coupled. A further bit line select circuit 353 of the YMUX circuit 313 is electrically coupled between a node of the SA 315 and the bit line BL0. The SA 315 comprises another node electrically coupled to the bias circuit 323 with the bias resistor 325. The SA 315 is electrically coupled to a power rail VDDHD. A header 377 of the header circuit 337 is electrically coupled between a power rail VDD and the power rail VDDHD. For simplicity, a voltage of a power rail is referred to by the same name of the power rail. For example, VDD is the voltage of the power rail VDD, VDDHD is the voltage of the power rail VDDHD, or the like.

Each memory cell in the memory array 301 comprises a data storage element and a word line select circuit electrically coupled in series to the corresponding bit line. For example, in the memory column 380 coupled to the bit line BL0, the data storage elements comprise e-fuses Rfuse_0, Rfuse_1, Rfuse_2, to Rfuse_(n–1), Rfuse_n, and word line select circuits WLS_0, WLS_1, WLS_2 to WLS_(n–1), WLS_n each comprise a device stack. The e-fuse Rfuse_0 and the word line select circuit WLS_0 are electrically coupled in series between the ground and the bit line BL0 and configure a memory cell, the e-fuse Rfuse_1 and the word line select circuit WLS_1 are electrically coupled in series between the ground and the bit line BL0, and configure a further memory cell, or the like.

An e-fuse is examples of a resistive data storage element. Other data storage element configurations, such as anti-fuse, metal-insulator-metal (MIM), resistive random-access memory (ReRAM), phase-change memory (PCM), ferro-electric RAM, magneto-resistive RAM, or the like, within the scopes of various embodiments. In some embodiments, an e-fuse comprises a metal fuse a example of which is described with respect to FIG. 4C.

In some embodiments, the device stack of each of the word line select circuits WLS_0, WLS_1, WLS_2 to WLS_(n–1), WLS_n corresponds to one or more of the device stacks 100A, 200A, 200C, and a device stack represented by the layout diagram 200E. The gates of the top semiconductor device MU and bottom semiconductor device ML in the device stack of each of the word line select circuits WLS_0, WLS_1, WLS_2 to WLS_(n–1), WLS_n are commonly coupled to a corresponding word line among the word lines WL0, WL1, to WL(n–1), WLn. In response to an access voltage applied to a word line, both the top semiconductor device MU and bottom semiconductor device ML of the corresponding device stack are turned ON. The word line select circuits WLS_0, WLS_1, WLS_2 to WLS_(n–1), WLS_n are sometimes referred to as access transistors.

In the example configuration in FIG. 3B, the bit line select circuits 350, 351, to 35m coupled between the corresponding bit line and the power rail VDDQ, and the power switch 375 coupled between the power rail VQPS and the power rail VDDQ also each comprise a device stack. While the device stacks of the word line select circuits WLS_0, WLS_1, WLS_2 to WLS_(n–1), WLS_n have the N-on-N structure, the device stacks of the bit line select circuits 350, 351 to 35m and power switch 375 have the P-on-P structure. In some embodiments, the gates of the top semiconductor device MU and bottom semiconductor device ML in the device stack of each of the bit line select circuits 350, 351, to 35m and the power switch 375 are commonly coupled to receive the same access voltage, so as to turn ON the corresponding top semiconductor device MU and bottom semiconductor device ML at substantially the same time.

In an example program operation for the memory cell including the e-fuse Rfuse_1, the control circuit 330 supplies an access voltage PS to the commonly coupled gates of the stacked P-type transistors in the power switch 375, to turn ON the stacked P-type transistors in the power switch 375 and electrically couple the power rail VQPS to the power rail VDDQ. The control circuit 330 further supplies an access voltage YPASS0 to the commonly coupled gates of the stacked P-type transistors in the bit line select circuit 350, to turn ON the stacked P-type transistors in the bit line select circuit 350 and electrically couple the power rail VDDQ to the bit line BL0. The access voltage YPASS0 is supplied in accordance with the decoded column address of the memory cell selected for the program operation. The control circuit 330 also supplies an access voltage through the word line WL1 to the commonly coupled gates of the stacked N-type transistors in the word line select circuit WLS_1, to turn ON the stacked N-type transistors in the word line select circuit WLS_1. The access voltage is supplied to the word line WL1 in accordance with the decoded row address of the memory cell selected for the program operation.

A program current flows along a program current path 391 from the power rail VQPS through the turned ON P-type transistors of the power switch 375 to the power rail VDDQ, then through the turned ON P-type transistors of the bit line select circuit 350 to the bit line BL0, then through the e-fuse Rfuse_1 and the turned ON N-type transistors of the word line select circuit WLS_1 to the ground. The program current is sufficient to blow the e-fuse Rfuse_1. As a result, a programmed logic value, e.g., logic "1" or logic "0," is stored in the memory cell comprising the e-fuse Rfuse_1. In a memory cell of which the corresponding e-fuse has not been blown, the other logic value, e.g., logic "0" or logic "1," is stored.

In some situations, the voltage VQPS or VDDQ, also referred to herein as the program voltage, is high which potentially causes undesirable voltage stress and/or reliability concerns. In some embodiments, such stress and/or concerns are eliminated or at least mitigated by the serial connection of multiple semiconductor devices in one or more of the power switch 375, bit line select circuit 350, word line select circuit WLS_1. One or more further advantages described herein are achievable in the memory device 300.

In an example read operation of the memory cell including the e-fuse Rfuse_0, the control circuit 330 supplies an access voltage PD to a P-type transistor of the header 377, to turn ON the P-type transistor and electrically couple the power rail VDD to the power rail VDDHD. The control circuit 330 further supplies an access voltage to an N-type transistor in the bit line select circuit 353, to turn ON the N-type transistor and electrically couple the SA 315 to the bit line BL0. In some embodiments, the access voltage is supplied to the bit line select circuit 353 in accordance with the decoded column address of the memory cell selected for the read operation. The control circuit 330 further supplies an access voltage through the word line WL0 to the commonly coupled gates of the stacked N-type transistors in the word line select circuit WLS_0, to turn ON the stacked N-type transistors in the word line select circuit WLS_0. The access voltage is supplied to the word line WL0 in accordance with the decoded row address of the memory cell selected for the program operation.

If the e-fuse Rfuse_0 has not been programed before, the e-fuse Rfuse_0 remains intact and permits a read current to flow along a read current path 393 from the power rail VDD through the SA 315, the turned ON N-type transistor of the bit line select circuit 353, the e-fuse Rfuse_0 which has not been blown, and the turned ON N-type transistors of the word line select circuit WLS_0 to the ground. If the e-fuse Rfuse_0 has been programed before, i.e., the e-fuse Rfuse_0 has been blown, there is no current flowing along the read current path 393. The SA 315 is configured to sense the presence or absence of a read current on the read current path 393, by a comparison with a reference current or voltage created by the bias circuit 323 and bias resistor 325. Depending on the sensed read current, or lack thereof, a corresponding logic value is detected as the datum read from the e-fuse Rfuse_0.

In the example configuration in FIG. 3B, the voltage VDD or VDDHD, also referred to herein as the read voltage, is low without causing undesirable voltage stress and/or reliability concerns. As a result, a single transistor in each of the header 377, bit line select circuit 353 is sufficient. However, in situations where the read voltage potentially causes undesirable voltage stress and/or reliability concerns, the transistor in at least one of the header 377 or bit line select circuit 353 is replaced with a device stack, in accordance with some embodiments.

Figure 4A:
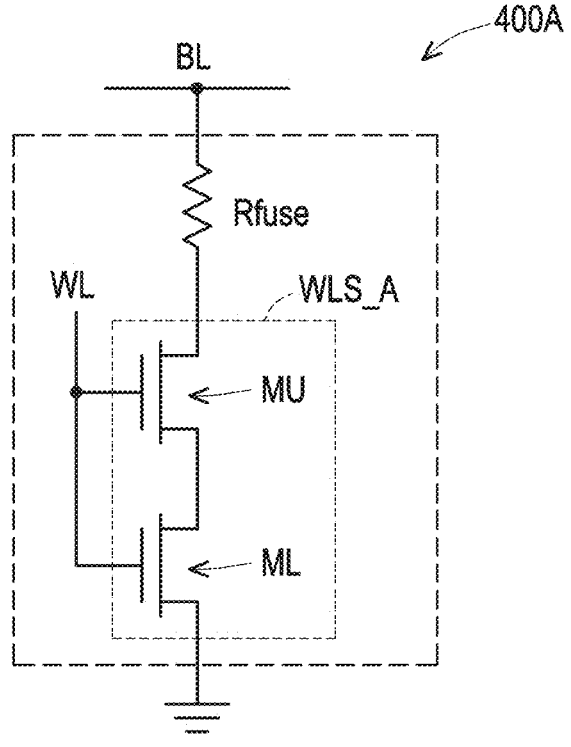
FIGS. 4A-4B are schematic circuit diagrams of various memory cells, in accordance with some embodiments.

FIG. 4A is a schematic circuit diagram of a memory cell 400A, in accordance with some embodiments. In some embodiments, the memory cell 400A corresponds to one or more of the memory cells MC in the memory device 300. For simplicity, corresponding components in FIGS. 3A, 3B, 4A are designated by the same reference numerals.

The memory cell 400A comprises a data storage element Rfuse and a word line select circuit WLS_A electrically coupled in series between a bit line BL and a node of a power supply voltage, e.g., the ground. The word line select circuit WLS_A comprises a device stack in which the top semiconductor device MU and the bottom semiconductor device ML are coupled in series, e.g., as described with respect to FIGS. 2A, 2C. This configuration corresponds to the memory cell configuration described with respect to FIG. 3B. In at least one embodiment, the memory cell 400A is advantageous in applications with a high operating voltage, e.g., a high program voltage. In at least one embodiment, one or more further advantages described herein are achievable by the memory cell 400A and/or by a memory device including the memory cell 400A.

Figure 4B:
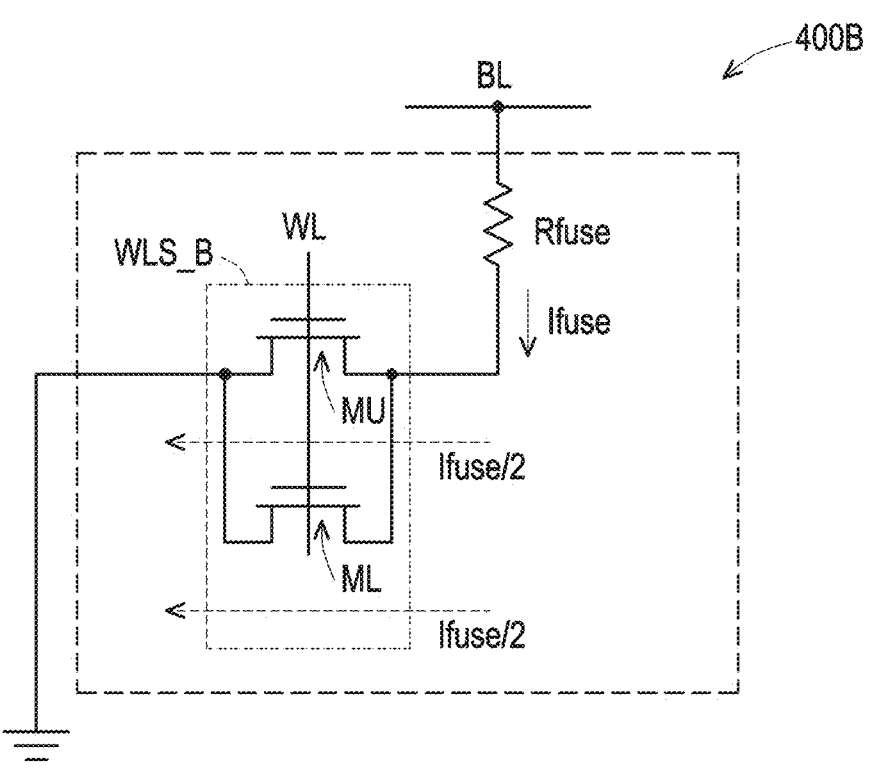

FIG. 4B is a schematic circuit diagram of a memory cell 400B, in accordance with some embodiments. In some embodiments, the memory cell 400B corresponds to one or more of the memory cells MC in the memory device 300. For simplicity, corresponding components in FIGS. 3A, 3B, 4A, 4B are designated by the same reference numerals.

The memory cell 400B comprises a data storage element Rfuse and a word line select circuit WLS_B electrically coupled in series between a bit line BL and the ground. The word line select circuit WLS_B comprises a device stack in which the top semiconductor device MU and the bottom semiconductor device ML are coupled in parallel, e.g., as described with respect to FIGS. 2B, 2D. In some embodiments, an advantage of the memory cell 400B comprises a reduced current (Ifuse/2 or half of the program current Ifuse) flowing thru each of the parallelly coupled top semiconductor device MU and bottom semiconductor device ML. As a result, it is possible, in one or more embodiments, to supply a sufficiently high program current to successfully program the data storage element Rfuse, without concerns regarding the reliability of the semiconductor devices in the device stack. In other words, the memory cell 400B is advantageous in applications with a high operating current, e.g., a high program current. In at least one embodiment, one or more further advantages described herein are achievable by the memory cell 400B and/or by a memory device including the memory cell 400B.

Figure 4C:
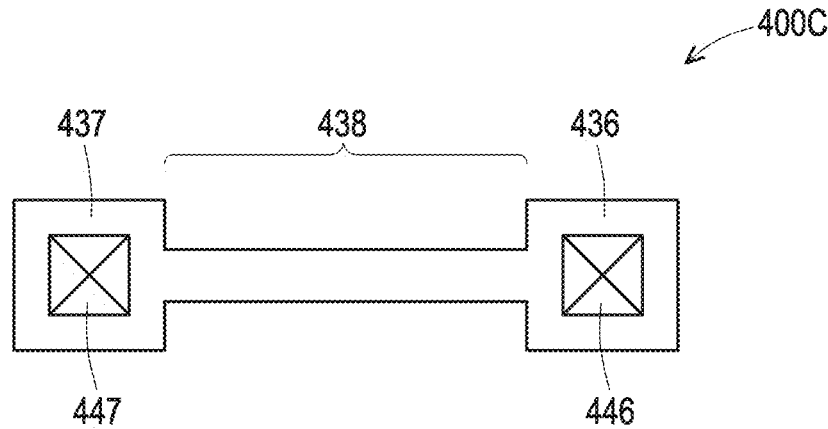
FIG. 4C is a schematic layout diagram or plan view of a data storage element, in accordance with some embodiments.

FIG. 4C is a schematic layout diagram or plan view of a data storage element 400C, in accordance with some embodiments. In some embodiments, the data storage element 400C corresponds to one or more of the data storage elements in the memory device 300.

The data storage element 400C comprises a metal fuse which has an opposite end portions 436, 437 and a middle section 438. In some embodiments, the end portions 436, 437 and middle section 438 correspond to the end portions 236, 237, and middle section 238 of the M2 conductive pattern 235 described with respect to FIGS. 2C-2D. The middle section 438 has a reduced width compared to the end portions 436, 437, and is configured to be blown to disconnect the end portions 436, 437 from each other, in response to a sufficient program current flowing through the metal fuse. The end portions 436, 437 are electrically coupled to other circuit elements by corresponding vias 446, 447. For example, the via 446 and further conductive features connected thereto electrically couple the end portion 436 of the metal fuse to a bit line, whereas the via 447 and further conductive features connected thereto electrically couple the end portion 437 of the metal fuse to an access transistor or word line select circuit, as described herein.

Figure 5B:
FIGS. 5A-5H are schematic cross-sectional views of an IC device at various stages in a manufacturing process, in accordance with some embodiments.
Figure 5B:
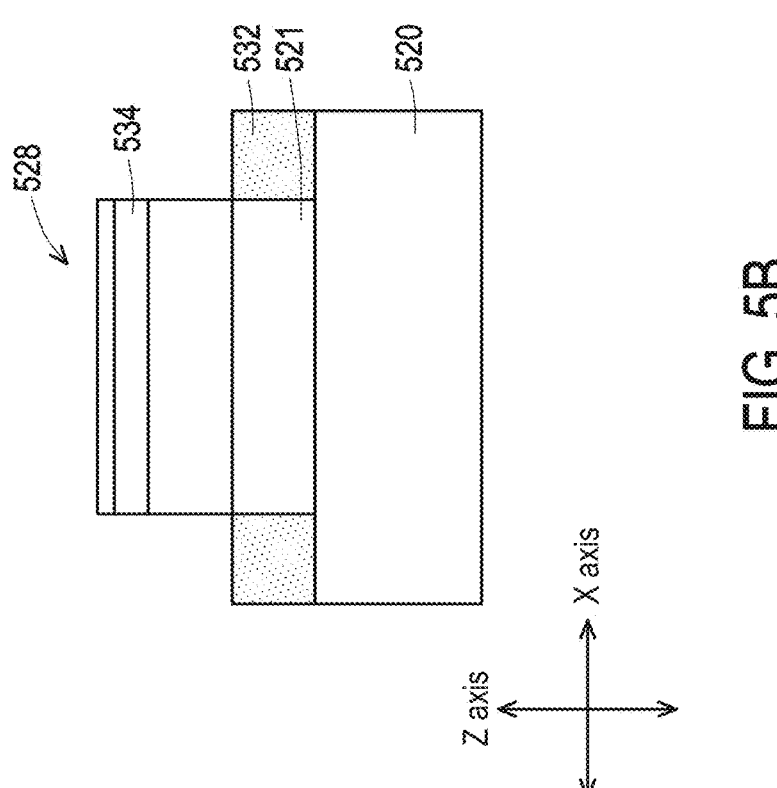
Figure 5A:
Figure 5A:
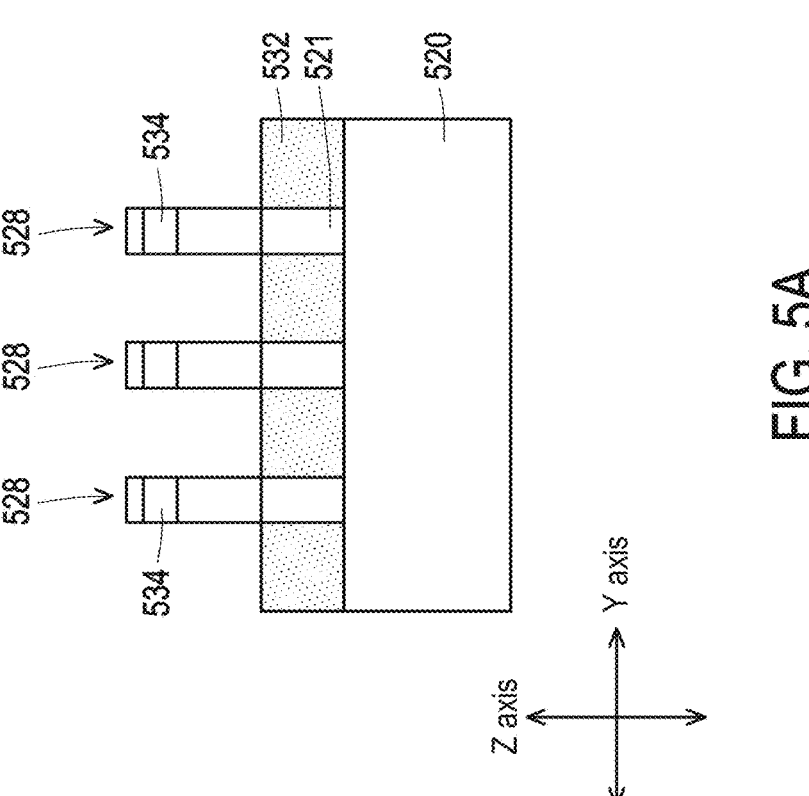

FIGS. 5A-5H are schematic cross-sectional views of an IC device 500 at various stages in a manufacturing process, in accordance with some embodiments. FIG. 5A is a schematic cross-sectional view in the Y-Z plane, and FIGS. 5B-5H are schematic cross-sectional views in the X-Z plane. In some embodiments, the manufacturing process described with respect to FIGS. 5A-5H is applicable to fabricate one or more device stacks as described herein. Components of the IC device 500 having corresponding components in the IC device 100 are designated by the reference numerals of the IC device 100 increased by five hundred.

In FIG. 5A, a plurality of fins 528 is formed over a substrate 520. Each of the fins 528 comprises a substrate portion 521 of the substrate 520, and a stack of semiconductor layers 534. An STI 532 is formed over the substrate 520 and between the fins 528. In some embodiments, detailed operations are similar to those provided with respect to FIG. 1B. A structure 500A is obtained.

FIG. 5B is a schematic cross-sectional view of the structure 500A in FIG. 5A, but in a different plane, i.e., in the X-Z plane instead of the Y-Z plane in FIG. 5A. One of the fins 528 is visible in FIG. 5B.

Figure 5D:
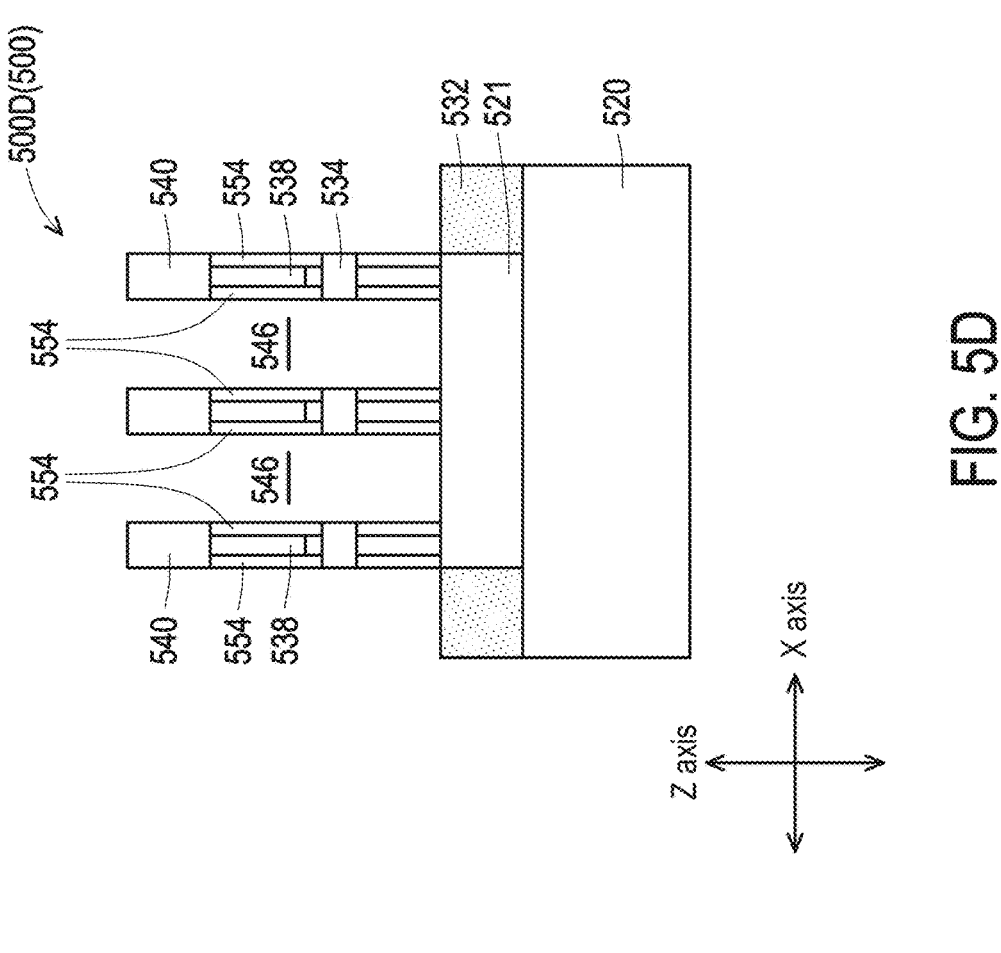
Figure 5C:
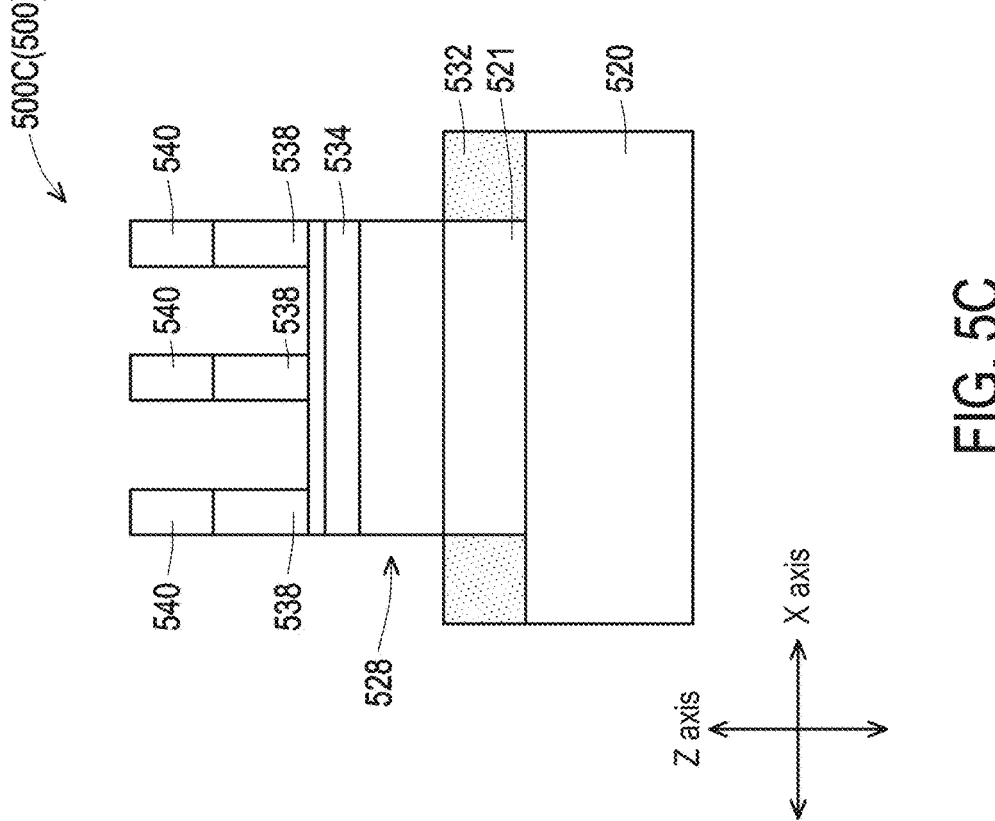

In FIG. 5C, sacrificial gate electrode layers 538 and mask structures 540 are deposited and patterned over the fins 528. In some embodiments, detailed operations are similar to those provided with respect to FIG. 1B. A structure 500C is obtained.

In FIG. 5D, the mask structures 540 are used as a mask for forming trenches 546 into the fins 528. Spacers 554 are formed on sidewalls of the trenches 546. In some embodiments, detailed operations are similar to those provided with respect to FIGS. 1C, 1D. A structure 500D is obtained.

Figure 5F:
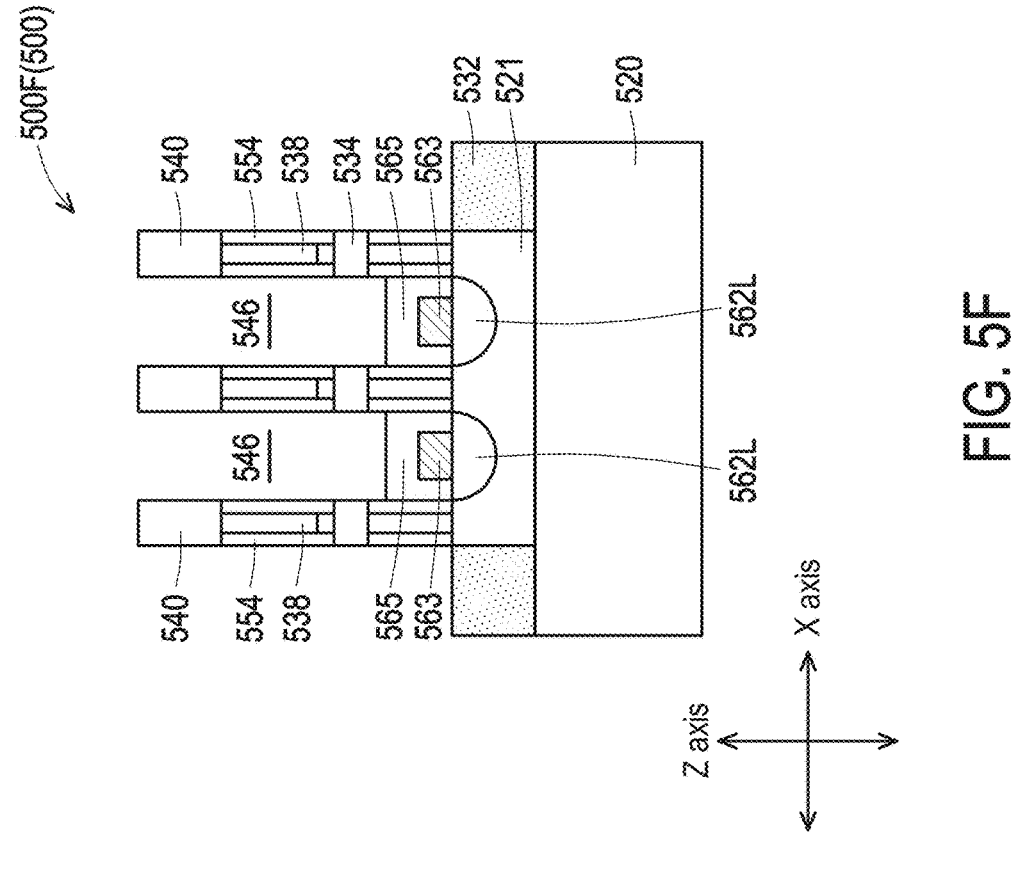
Figure 5E:
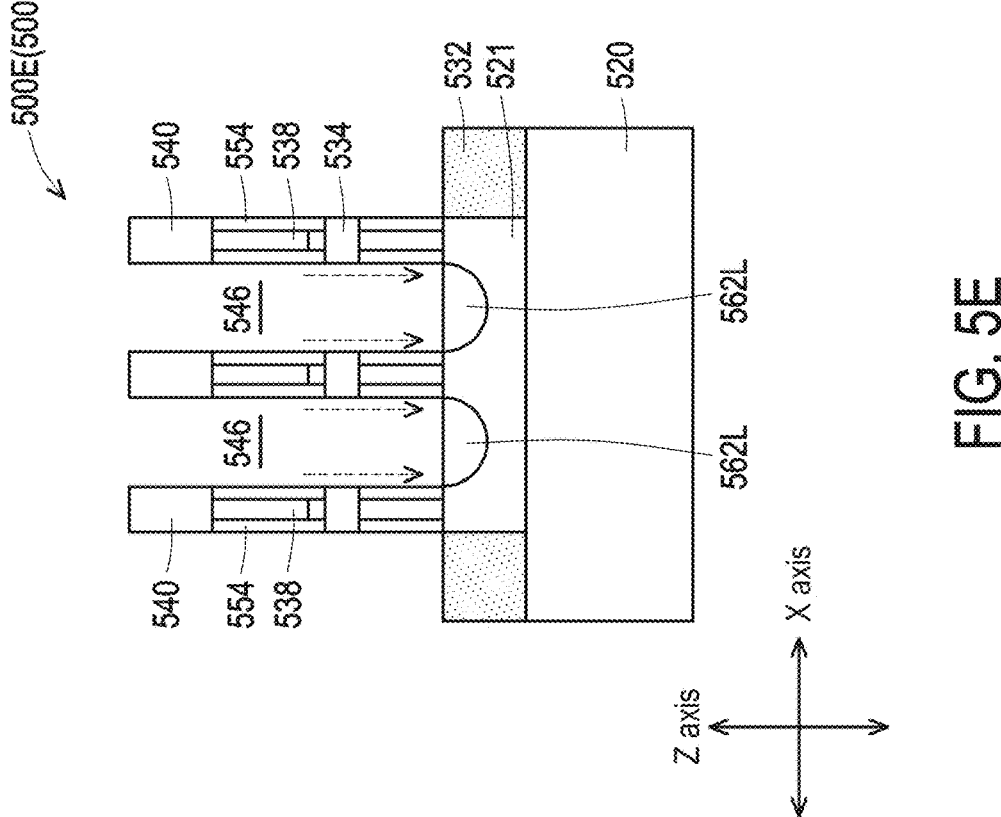

In FIG. 5E, source/drains 562L of a bottom semiconductor device are formed in regions of the substrate portion 521 exposed at bottoms of the trenches 546. For example, an epitaxial growth processes is performed to form the source/drains 562L. A structure 500E is obtained. In the example configuration of the IC device 500 described with respect to FIG. 5E, the bottom semiconductor device is a FinFET device, and the processes for forming the bottom semiconductor device comprise FinFET processes. This is different from example configurations described with respect to FIGS. 1A-1E, where the bottom semiconductor device is a nanosheet device, and the processes for forming such a nanosheet, bottom semiconductor device comprise nanosheet processes as described with respect to FIG. 1D. In some embodiments, the bottom semiconductor device of the IC device 500 comprises a nanosheet device which is formed by one or more nanosheet processes similar to those described with respect to FIG. 1D.

In FIG. 5F, source/drain contacts 563 are correspondingly formed over the source/drains 562L, e.g., by deposition and patterning processes. An isolation structure 565 is formed over each of the source/drain contacts 563, e.g., by filling the trenches 546 with a dielectric material, and then removing a portion of the dielectric material to obtain the isolation structure 565. A structure 500F is obtained.

Figure 5H:
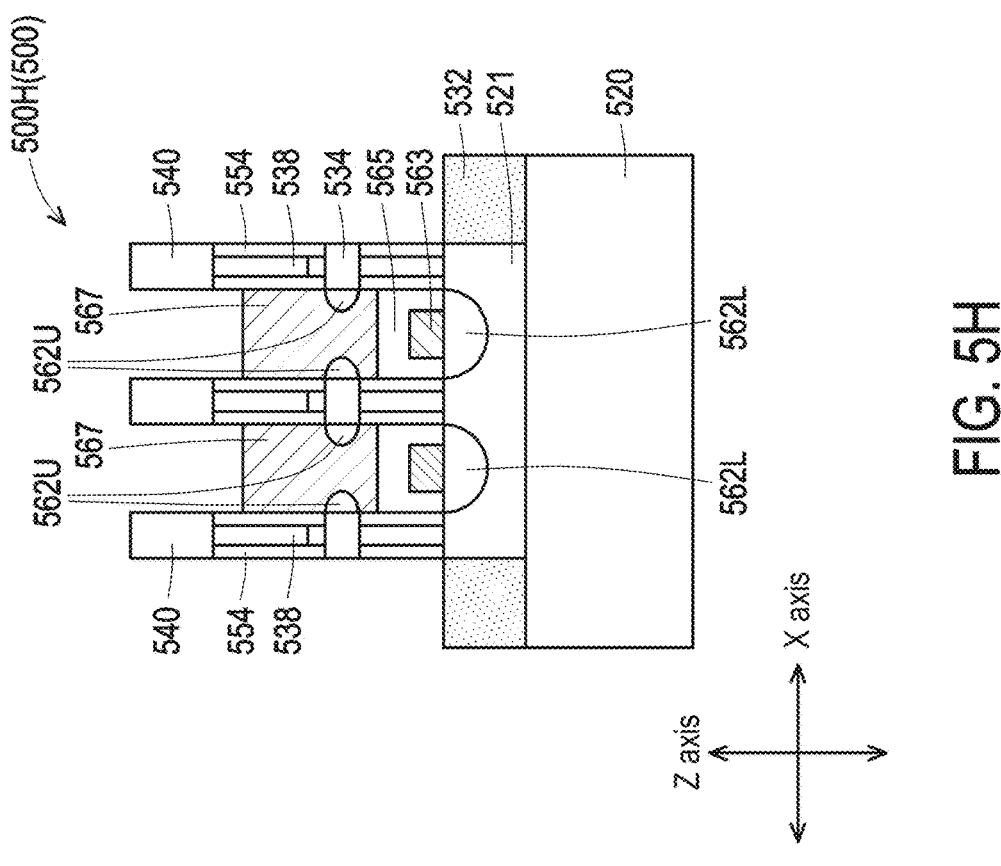
Figure 5G:
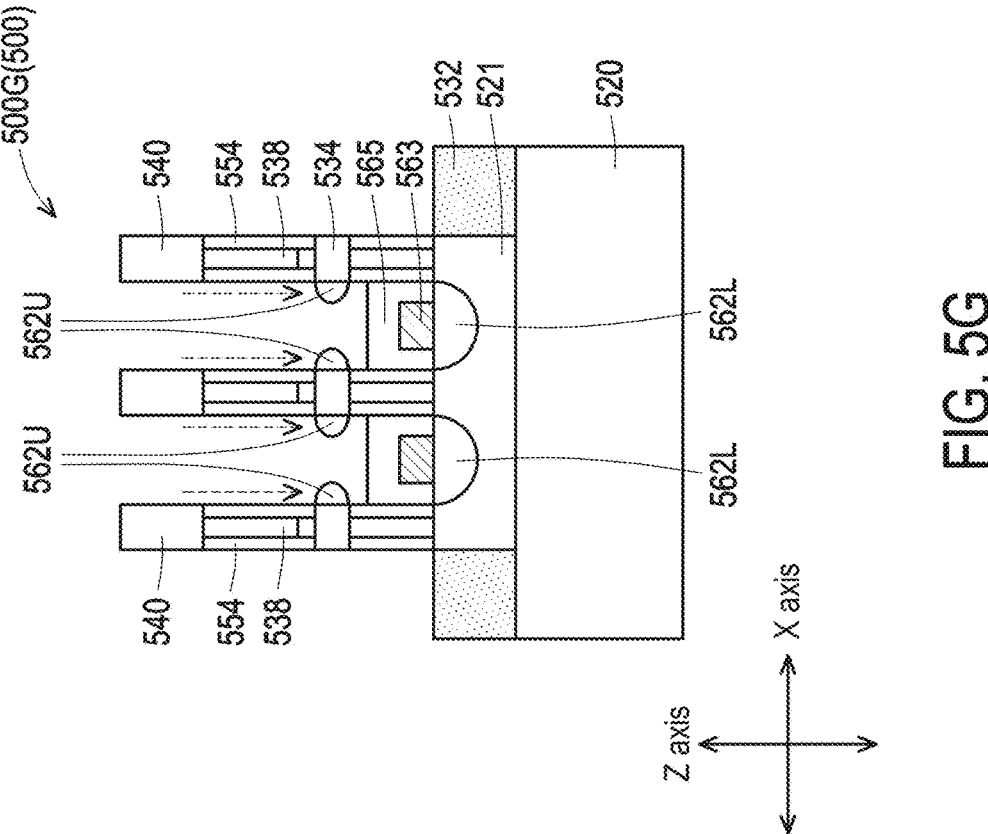

In FIG. 5G, source/drains 562U of a top semiconductor device are formed to be in contact with exposed edge portions of the stack of semiconductor layers 534. For example, an epitaxial growth process is performed to form the source/drains 562U. The source/drains 62U have the same conductivity type as the source/drains 62L. In some embodiments, detailed operations are similar to those provided with respect to FIG. 1D. A structure 500G is obtained.

In FIG. 5H, source/drain contacts 567 are correspondingly formed over the source/drains 562U, e.g., by deposition and patterning processes. A structure 500H is obtained.

In some embodiments, the manufacturing process further comprises one or more operations described with respect to one or more of FIGS. 2B-2F. Examples of further operations include, but are not limited to, forming one or more interconnects MDLI1 and/or MGLI interconnect, forming a front side redistribution structure, flipping the substrate and the circuits thereon upside-down, then forming a back side redistribution structure on the back side of the substrate, or the like. In some embodiments, the formation of the front side redistribution structure comprises forming an array of metal fuses each being configured as described with respect to one or more of FIGS. 2C, 2D, 4C. Each of the metal fuses is coupled to a corresponding device stack configured as an access transistor (or word line select circuit) in an array of device stacks. In at least one embodiment, one or more advantages described herein are achievable by IC devices manufactured by the process described with respect to FIGS. 5A-5H.

Figure 6A:
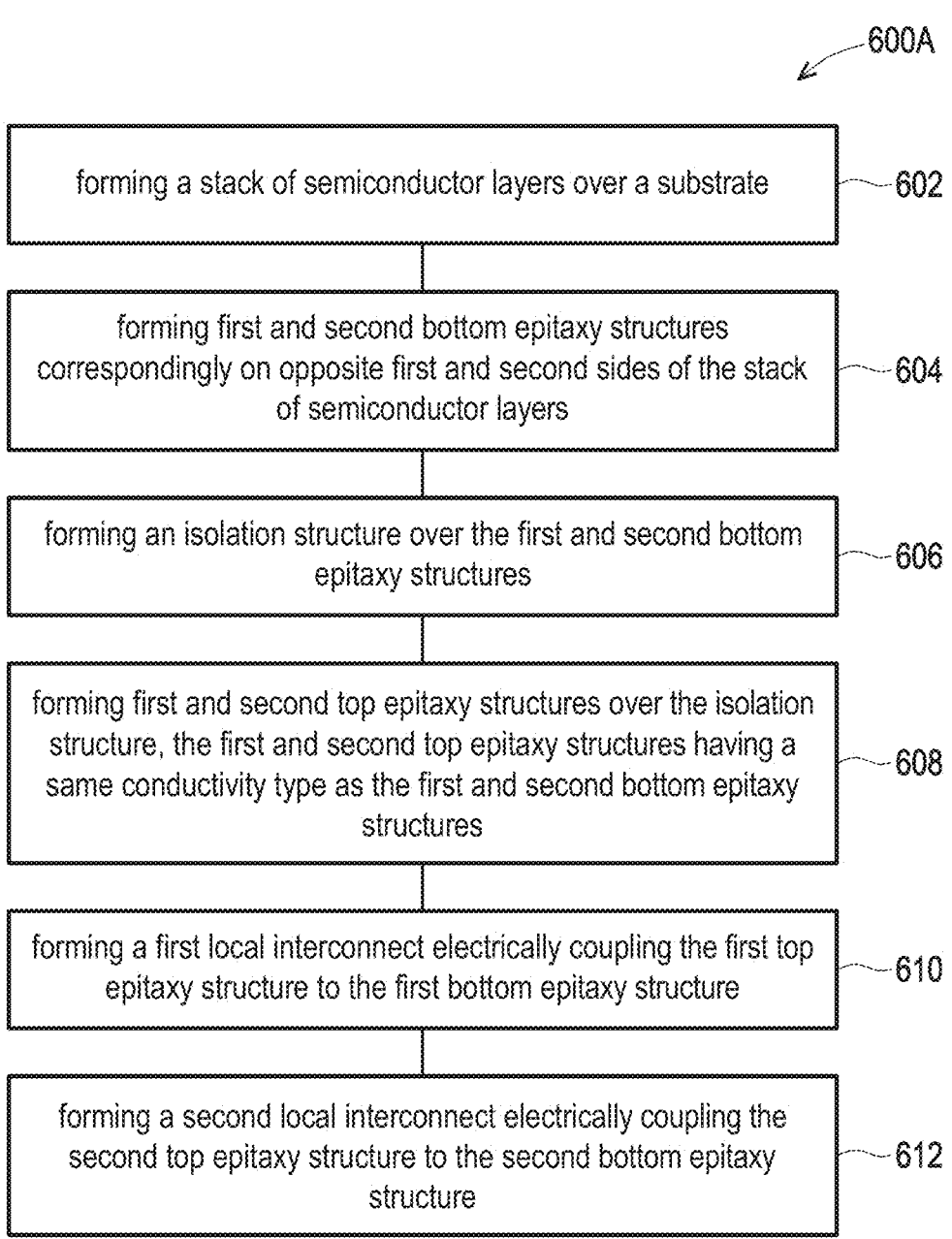

FIG. 6A is a flow chart of a method 600A of manufacturing an IC device, in accordance with some embodiments. In some embodiments, the method 600A is applicable to manufacture one or more IC devices or memory devices as described herein.

At operation 602, a stack of semiconductor layers is formed over a substrate. For example, as described with respect to FIGS. 1B-1C, a stack of semiconductor layers 34 is formed over a substrate 20.

At operation 604, first and second bottom epitaxy structures are formed correspondingly on opposite first and second sides of the stack of semiconductor layers. For example, as described with respect to FIG. 1D, a pair of source/drain epitaxy structures 62L is formed on opposite first and second sides of the stack of semiconductor layers 34 in the middle of FIG. 1D.

At operation 606, an isolation structure is formed over the first and second bottom epitaxy structures. For example, as described with respect to FIG. 1D, an isolation structure comprising a liner 63 and a dielectric material 68 is formed over each of the source/drain epitaxy structures 62L.

At operation 608, first and second top epitaxy structures are formed over the isolation structure, wherein the first and second top epitaxy structures have a same conductivity type as the first and second bottom epitaxy structures. For example, as described with respect to FIG. 1D, a pair of source/drain epitaxy structures 62U is formed over the isolation structure comprising the liner 63 and the dielectric material 68. Further, the sourced drain epitaxy structures 62U and the source/drain epitaxy structures 62L have the same conductivity type, to correspondingly form top and bottom semiconductor devices of the same conductivity type in an N-on-N structure or a P-on-P structure.

At operation 610, a first local interconnect is formed to electrically couple the first top epitaxy structure to the first bottom epitaxy structure. For example, as described with respect to FIG. 2C, an interconnect MDLI1 is formed to electrically couple a top sourced drain 211 to the corresponding, underlying bottom source/drain 221. The resulting structure comprises a device stack with serially coupled top and bottom semiconductor devices which, in one or more embodiments, is advantageous in high voltage applications.

At operation 612, a second local interconnect is formed to electrically couple the second top epitaxy structure to the second bottom epitaxy structure. For example, as described with respect to FIG. 2D, an interconnect MDLI2 is formed to electrically couple a further top source/drain 212 to the corresponding, underlying bottom source/drain 222. The resulting structure comprises a device stack with parallelly coupled top and bottom semiconductor devices which, in one or more embodiments, is advantageous in high current applications. In some embodiments, at least one of operations 610, 612 is omitted. In some embodiments, one or more advantages described herein are achievable by one or more memory devices or IC devices manufactured by the method 600A.

FIG. 6B is a flow chart of a method 600B of operating a memory device comprising device stacks, in accordance with some embodiments. In some embodiments, the method 600B is performed in a program operation of a memory cell in the memory device, as described with respect to one or more of FIGS. 2A, 2B, 3B, 4A, 4B.

At operation 632, an access voltage is applied to a common gate of a bottom semiconductor device and a top semiconductor device stacked over the bottom semiconductor device, to turn ON both the bottom semiconductor device and the top semiconductor device. For example, as described with respect to FIG. 3B, an access voltage is applied, through a word line WL1, to the common gate of a bottom semiconductor device ML and a top semiconductor device MU stacked over the bottom semiconductor device ML in the device stack of the word line select circuit WLS_1. As a result, both top semiconductor device MU and bottom semiconductor device ML are turned ON.

At operation 634, a program current is supplied to flow through a data storage element and the turned ON bottom semiconductor device and top semiconductor device, and to program the data storage element. For example, as described with respect to FIG. 3B, a control circuit 330 is configured to turn ON both top and bottom semiconductor devices in a device stack of the power switch 375, and turn ON both top and bottom semiconductor devices in a device stack of the bit line select circuit 350. As a result, a program current is caused to flow along the program current path 391 from the power rail VQPS to the power rail VDDQ, then to the bit line BL0, then through the e-fuse Rfuse_1 and the turned ON top semiconductor device MU and bottom semiconductor device ML of the word line select circuit WLS_1 to the ground. The program current is sufficient to blow the e-fuse Rfuse_1, thereby programing the e-fuse Rfuse_1. A similar program operation is performed when the word line select circuit comprises a device stack with parallelly coupled semiconductor devices, as described with respect to FIG. 4B. In at least one embodiment, one or more advantages described herein are achievable by the method 600B.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 7:
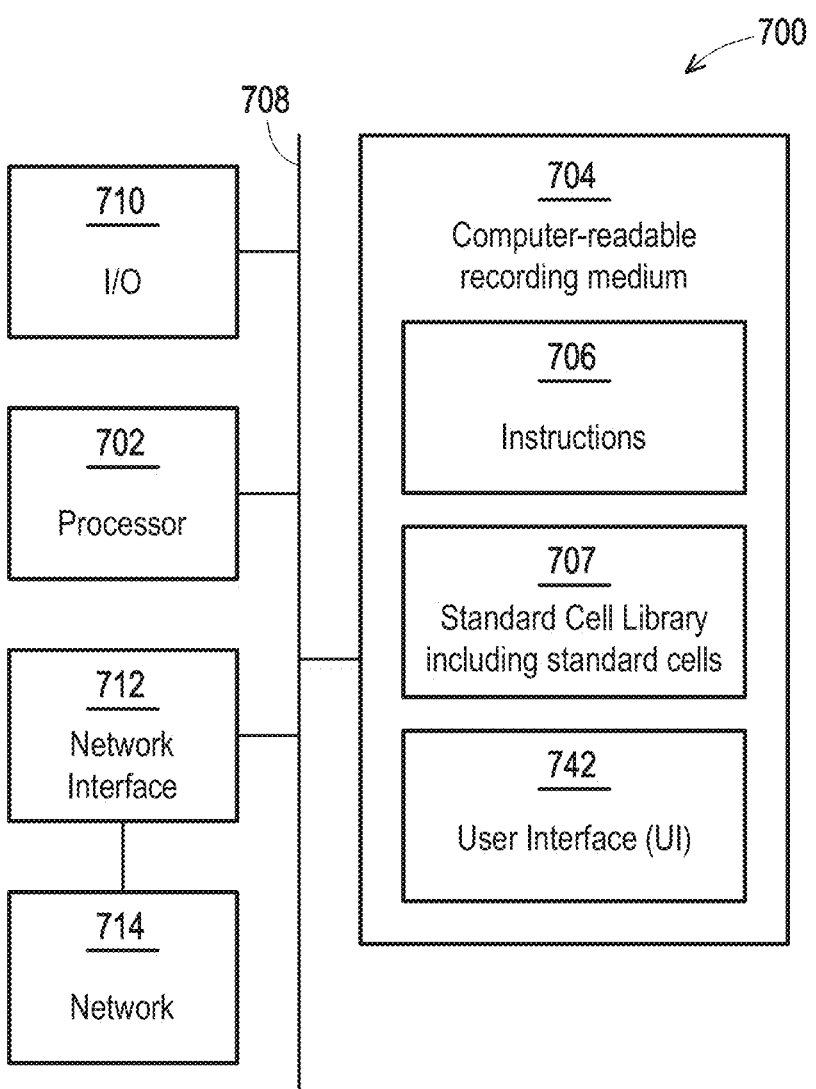
FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an APR system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable recording medium 704. Recording medium 704, amongst other things, is encoded with, i.e., stores, computer program code 706, i.e., a set of executable instructions. Execution of instructions 706 by hardware processor 702 represents (at least in part) an EDA tool which implements a portion or all of the methods described herein in accordance with one or more embodiments (hereinafter, the noted processes and/or methods).

Processor 702 is electrically coupled to computer-readable recording medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable recording medium 704 are capable of connecting to external elements via network 714. Processor 702 is configured to execute computer program code 706 encoded in computer-readable recording medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable recording medium 704 is an electronic, magnetic, optical, electro-magnetic, infrared, and/or a semiconductor system (or apparatus or device). For example, computer-readable recording medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable recording medium 704 includes a compact disk-read only memory (CD-ROM), a compact disk-read/write (CD-R/W), and/or a digital video disc (DVD).

In one or more embodiments, recording medium 704 stores computer program code 706 configured to cause system 700 (where such execution represents (at least in part) the EDA tool) to be usable for performing a portion or all of the noted processes and/or methods. In one or more embodiments, medium 704 also stores information which facilitates performing a portion or all of the noted processes and/or methods. In one or more embodiments, recording medium 704 stores library 707 of standard cells including such standard cells as disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
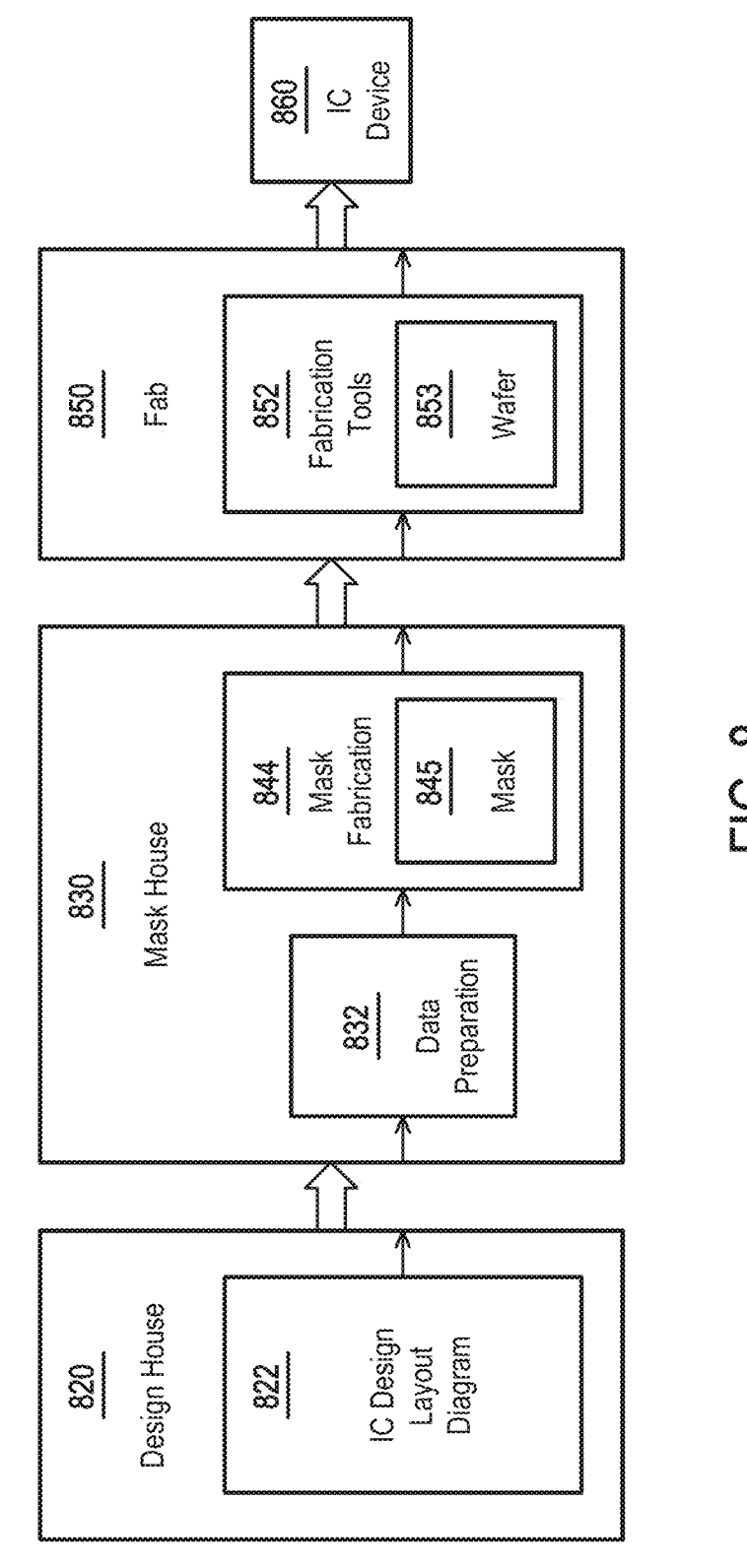
FIG. 8 is a block diagram of an IC device manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place-and-route operation. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

In some embodiments, an integrated circuit (IC) device comprises a substrate, a bottom semiconductor device over the substrate, and a top semiconductor device over the bottom semiconductor device in a thickness direction of the substrate. The top semiconductor device and the bottom semiconductor device are of a same conductivity type.

In some embodiments, a memory device comprises a bit line, a word line, a data storage element, and a word line select circuit. The word line select circuit comprises a bottom semiconductor device, and a top semiconductor device physically stacked on the bottom semiconductor device. The word line is electrically coupled to a gate of the top semiconductor device and a gate of the bottom semiconductor device. The word line select circuit and the data storage element are electrically coupled in series to the bit line.

In some embodiments, a method of manufacturing an integrated circuit (IC) device comprises forming a stack of semiconductor layers over a substrate, forming first and second bottom epitaxy structures correspondingly on opposite first and second sides of the stack of semiconductor layers, forming an isolation structure over the first and second bottom epitaxy structures, forming first and second top epitaxy structures over the isolation structure, and forming a first local interconnect electrically coupling the first top epitaxy structure to the first bottom epitaxy structure. The first and second top epitaxy structures have a same conductivity type as the first and second bottom epitaxy structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
   a substrate;
   a bottom semiconductor device over the substrate; and
   a top semiconductor device over the bottom semiconductor device in a thickness direction of the substrate,
   wherein
   the top semiconductor device and the bottom semiconductor device are of a same conductivity type, and
   at least one of
       a gate of the top semiconductor device is electrically coupled to a gate of the bottom semiconductor device, or
       at least one source/drain of the top semiconductor device is electrically coupled to at least one source/drain of the bottom semiconductor device.

2. The IC device of claim 1, wherein
   the gate of the top semiconductor device is electrically coupled to the gate of the bottom semiconductor device, and overlaps the gate of the bottom semiconductor device along the thickness direction.

3. The IC device of claim 1, wherein
   a first source/drain of the top semiconductor device is electrically coupled to a first source/drain of the bottom semiconductor device, and overlaps the first source/drain of the bottom semiconductor device along the thickness direction.

4. The IC device of claim 3, wherein
   a second source/drain of the top semiconductor device is electrically coupled to a second source/drain of the bottom semiconductor device, and overlaps the second source/drain of the bottom semiconductor device along the thickness direction.

5. The IC device of claim 1, further comprising:
   a gate-all-around (GAA) structure configuring both the gate of the top semiconductor device and the gate of the bottom semiconductor device.

6. The IC device of claim 1, further comprising:
   a data storage element, wherein
   the top semiconductor device and the bottom semiconductor device are electrically coupled to each other to configure an access transistor, and
   the access transistor is electrically coupled in series with the data storage element.

7. The IC device of claim 1, wherein
   the gate of the top semiconductor device is electrically coupled to the gate of the bottom semiconductor device, and
   the at least one source/drain of the top semiconductor device is electrically coupled to the at least one source/drain of the bottom semiconductor device.

8. The IC device of claim 1, wherein
   both the top semiconductor device and the bottom semiconductor device are N-type transistors.

9. The IC device of claim 1, wherein
   both the top semiconductor device and the bottom semiconductor device are P-type transistors.

10. The IC device of claim 1, wherein
    the gate of the top semiconductor device overlap the gate of the bottom semiconductor device along the thickness direction, and
    source/drains of the top semiconductor device correspondingly overlap source/drains of the bottom semiconductor device along the thickness direction.

11. A memory device, comprising:

a bit line;

a word line;

a data storage element; and a word line select circuit comprising:

a bottom semiconductor device; and a top semiconductor device physically stacked on the bottom semiconductor device, wherein the word line is electrically coupled to a gate of the top semiconductor device and a gate of the bottom semiconductor device, and the word line select circuit and the data storage element are electrically coupled in series to the bit line.

12. The memory device of claim 11, wherein the top semiconductor device and the bottom semiconductor device are electrically coupled in series to configure the word line select circuit.

13. The memory device of claim 11, wherein the top semiconductor device and the bottom semiconductor device are electrically coupled in parallel to configure the word line select circuit.

14. The memory device of claim 11, wherein the data storage element comprises a resistive data storage element.

15. The memory device of claim 11, wherein the data storage element comprises a metal fuse.

16. The memory device of claim 11, further comprising:

a power switch; and a bit line select circuit, wherein the power switch and the bit line select circuit are electrically coupled in series between the bit line and a first node of a first power supply voltage, and at least one of the power switch or the bit line select circuit comprises:

a further bottom semiconductor device, and a further top semiconductor device physically stacked on the further bottom semiconductor device, and electrically coupled in series to the further bottom semiconductor device.

17. The memory device of claim 16, wherein the top semiconductor device and the bottom semiconductor device are of a first conductivity type, and the further top semiconductor device and the further bottom semiconductor device are of a second conductivity type different from the first conductivity type.

18. The memory device of claim 16, wherein the word line select circuit and the data storage element are electrically coupled in series between the bit line and a second node of a second power supply voltage different from the first power supply voltage.

19. A method of manufacturing an integrated circuit (IC) device, the method comprising:

forming a stack of semiconductor layers over a substrate;

forming first and second bottom epitaxy structures correspondingly on opposite first and second sides of the stack of semiconductor layers;

forming an isolation structure over the first and second bottom epitaxy structures;

forming first and second top epitaxy structures over the isolation structure, the first and second top epitaxy structures having a same conductivity type as the first and second bottom epitaxy structures; and forming a first local interconnect electrically coupling the first top epitaxy structure to the first bottom epitaxy structure.

20. The method of claim 19, further comprising:

forming a second local interconnect electrically coupling the second top epitaxy structure to the second bottom epitaxy structure.

* * * * *